US010644368B2

(12) United States Patent
Stowell et al.

(10) Patent No.: US 10,644,368 B2
(45) Date of Patent: May 5, 2020

(54) PRESSURE BARRIER COMPRISING A TRANSPARENT MICROWAVE WINDOW PROVIDING A PRESSURE DIFFERENCE ON OPPOSITE SIDES OF THE WINDOW

(71) Applicant: Lyten, Inc., Sunnyvale, CA (US)

(72) Inventors: Michael W. Stowell, Sunnyvale, CA (US); Peter Todd Williams, San Carlos, CA (US)

(73) Assignee: LytEn, Inc., Sunnyvale, CA (US)

( * ) Notice: Subject to any disclaimer, the term of this patent is extended or adjusted under 35 U.S.C. 154(b) by 0 days.

(21) Appl. No.: 16/247,002

(22) Filed: Jan. 14, 2019

(65) Prior Publication Data

US 2019/0221909 A1  Jul. 18, 2019

Related U.S. Application Data

(60) Provisional application No. 62/617,605, filed on Jan. 16, 2018.

(51) Int. Cl.
  *H01P 1/08* (2006.01)
  *H01J 37/32* (2006.01)
  *H01P 3/12* (2006.01)

(52) U.S. Cl.
  CPC .......... *H01P 1/08* (2013.01); *H01J 37/32229* (2013.01); *H01J 37/32238* (2013.01); *H01P 3/12* (2013.01)

(58) Field of Classification Search
  CPC ........................................................ H01P 1/08
  (Continued)

(56) References Cited

U.S. PATENT DOCUMENTS 2,637,776 A * 5/1953 Edson ................. H01P 1/08
  333/252
3,001,160 A * 9/1961 Trousdale ............ H01P 1/08
  333/252

(Continued)

FOREIGN PATENT DOCUMENTS

CN  102757038 B  2/2014
CN  105870419 A  8/2016
(Continued)

OTHER PUBLICATIONS

International Search Report dated May 8, 2019 for PCT Patent Application No. PCT/US2019/013493.
(Continued)

*Primary Examiner* — Benny T Lee
(74) *Attorney, Agent, or Firm* — Paradice & Li LLP

(57) ABSTRACT

A pressure barrier comprising a window with a first side and a second side, a main section comprising a length, a first end, and a second end opposite the first end, a first gradient compression section adjacent to the first end of the main section, and a second gradient decompression section adjacent to the second end of the main section is described. A pressure difference can be formed between the first and second side of the window. The window can comprise a dielectric material, where an average dielectric constant of the gradient compression section increases toward the main section, and an average dielectric constant of the gradient decompression section decreases away from the main section. A microwave propagating in a propagation direction can enter the pressure barrier at the gradient compression section and exit the pressure barrier through the gradient decompression section.

14 Claims, 16 Drawing Sheets

(58) Field of Classification Search
USPC .......................................................... 333/252
See application file for complete search history.

(56) References Cited

U.S. PATENT DOCUMENTS

| | | | |
|---|---|---|---|
| 3,706,445 | A | 12/1972 | Gentry |
| 4,688,009 | A | 8/1987 | Ferguson et al. |
| 5,324,553 | A | 6/1994 | Ovshinsky et al. |
| 5,515,011 | A | 5/1996 | Pasco |
| 5,556,475 | A | 9/1996 | Besen et al. |
| 5,572,866 | A | 11/1996 | Loving |
| 5,693,173 | A | 12/1997 | Colombo et al. |
| 5,874,705 | A | 2/1999 | Duan |
| 6,120,741 | A | 9/2000 | Jacquault et al. |
| 6,156,114 | A | 12/2000 | Bell et al. |
| 6,224,736 | B1 | 5/2001 | Miyamoto |
| 6,337,110 | B1 | 1/2002 | Delaunay et al. |
| 6,340,912 | B1 | 1/2002 | Gerstenberg et al. |
| 6,383,301 | B1 | 5/2002 | Bell et al. |
| 6,582,778 | B2 | 6/2003 | Namiki et al. |
| 6,805,779 | B2 | 10/2004 | Chistyakov |
| 6,914,556 | B1 | 7/2005 | Nyswander |
| 6,916,400 | B2 | 7/2005 | Moisan et al. |
| 7,022,149 | B2 | 4/2006 | Krause et al. |
| 7,102,110 | B2 | 9/2006 | Shinohara |
| 7,608,798 | B2 | 10/2009 | Kumar et al. |
| 7,799,119 | B2 | 9/2010 | Zakrzewski et al. |
| 7,875,322 | B2 | 1/2011 | Kobayashi et al. |
| 8,034,321 | B2 | 10/2011 | Mauthner et al. |
| 8,075,869 | B2 | 12/2011 | Zhu et al. |
| 8,222,579 | B2 | 7/2012 | Taguchi et al. |
| 8,337,764 | B2 | 12/2012 | Yang et al. |
| 8,475,760 | B2 | 7/2013 | Rajala et al. |
| 8,603,402 | B2 | 12/2013 | Chang et al. |
| 8,610,353 | B2 | 12/2013 | Itoh et al. |
| 8,636,960 | B2 | 1/2014 | Spitzl et al. |
| 8,808,507 | B2 | 8/2014 | Kasin |
| 8,933,629 | B2 | 1/2015 | Heil et al. |
| 8,968,588 | B2 | 3/2015 | Zhao et al. |
| 9,051,185 | B2 | 6/2015 | Levendis et al. |
| 9,091,584 | B2 * | 7/2015 | Vogt et al. ............ G01F 23/284 |
| 9,156,699 | B2 | 10/2015 | Yamada et al. |
| 9,293,302 | B2 | 3/2016 | Risby et al. |
| 9,767,992 | B1 | 9/2017 | Stowell |
| 9,862,602 | B1 | 1/2018 | Riso et al. |
| 9,862,606 | B1 | 1/2018 | Cook et al. |
| 2002/0050323 | A1 | 5/2002 | Moisan et al. |
| 2002/0067229 | A1 | 6/2002 | Lubbers |
| 2003/0086859 | A1 | 5/2003 | Kawakami et al. |
| 2003/0138365 | A1 | 7/2003 | Obidniak et al. |
| 2004/0029339 | A1 | 2/2004 | Yamamoto et al. |
| 2004/0265211 | A1 | 12/2004 | Dillon et al. |
| 2005/0003247 | A1 | 1/2005 | Pham |
| 2005/0089684 | A1 | 4/2005 | Barron et al. |
| 2005/0123467 | A1 | 6/2005 | Harutyunyan |
| 2005/0219015 | A1 | 10/2005 | Mitrovic |
| 2005/0253529 | A1 | 11/2005 | Kumar et al. |
| 2007/0212254 | A1 | 9/2007 | Nagatsu |
| 2008/0029030 | A1 | 2/2008 | Goto et al. |
| 2008/0176058 | A1 | 7/2008 | Maschmann et al. |
| 2009/0060805 | A1 | 3/2009 | Muradov et al. |
| 2009/0194528 | A1 | 8/2009 | Kotzian et al. |
| 2009/0196801 | A1 | 8/2009 | Mills |
| 2009/0220767 | A1 | 9/2009 | Schlogl et al. |
| 2010/0036023 | A1 | 2/2010 | Weng et al. |
| 2010/0056819 | A1 | 3/2010 | Jang et al. |
| 2010/0214043 | A1 | 8/2010 | Courtney et al. |
| 2010/0295023 | A1 | 11/2010 | Franklin et al. |
| 2011/0033639 | A1 | 2/2011 | Coll et al. |
| 2011/0059006 | A1 | 3/2011 | Donnet et al. |
| 2011/0206946 | A1 | 8/2011 | Schmidt et al. |
| 2012/0058397 | A1 | 3/2012 | Zhamu et al. |
| 2012/0094175 | A1 | 4/2012 | Sheem et al. |
| 2012/0258374 | A1 | 10/2012 | Raston et al. |
| 2013/0150516 | A1 | 6/2013 | Lettow |
| 2013/0248773 | A1 | 9/2013 | Chang et al. |
| 2013/0270110 | A1 | 10/2013 | Sasai et al. |
| 2013/0296479 | A1 | 11/2013 | Martin et al. |
| 2013/0310495 | A1 | 11/2013 | Kim et al. |
| 2014/0030181 | A1 | 1/2014 | Liu et al. |
| 2014/0159572 | A1 | 6/2014 | Risby et al. |
| 2014/0208638 | A1 | 7/2014 | Thorre et al. |
| 2014/0251955 | A1 | 9/2014 | Itoh et al. |
| 2014/0263202 | A1 | 9/2014 | Partridge |
| 2014/0313636 | A1 | 10/2014 | Tour et al. |
| 2014/0353207 | A1 | 12/2014 | Strohm et al. |
| 2015/0044565 | A1 | 2/2015 | Wang et al. |
| 2015/0073072 | A1 | 3/2015 | Kim et al. |
| 2015/0179294 | A1 | 6/2015 | Kim et al. |
| 2015/0246813 | A1 | 9/2015 | Koveal et al. |
| 2015/0267063 | A1 | 9/2015 | Drewer et al. |
| 2016/0059197 | A1 | 3/2016 | Stevanovic et al. |
| 2016/0185603 | A1 | 6/2016 | Bozalina et al. |
| 2016/0276055 | A1 | 9/2016 | Choi et al. |
| 2016/0340495 | A1 | 11/2016 | Pan et al. |
| 2017/0174520 | A1 | 6/2017 | Walters et al. |
| 2018/0099871 | A1 | 4/2018 | Tanner et al. |

FOREIGN PATENT DOCUMENTS

| | | |
|---|---|---|
| CN | 106398802 A | 2/2017 |
| EP | 0184475 B1 | 5/1989 |
| EP | 1502486 B1 | 11/2011 |
| EP | 2702839 B1 | 3/2015 |
| JP | 2000150195 A | 5/2000 |
| JP | 2001122690 A | 5/2001 |
| JP | 2002299323 A | 10/2002 |
| JP | 2004346385 A | 12/2004 |
| JP | 2011142457 A | 7/2011 |
| JP | 2012036448 A | 2/2012 |
| WO | 1999012184 A2 | 3/1999 |
| WO | 2001009031 A1 | 2/2001 |
| WO | 2004092058 A2 | 10/2004 |
| WO | 2010094969 A1 | 8/2010 |
| WO | 2014090992 A3 | 8/2014 |
| WO | 2015189643 A1 | 12/2015 |
| WO | 2015193155 A1 | 12/2015 |
| WO | 2016001476 A1 | 1/2016 |
| WO | 2016135328 A1 | 9/2016 |

OTHER PUBLICATIONS

"Pyrolytic Carbon," Biomedical Engineering Desk Reference, Oxford, UK: Elsevier, 2009, pp. iii-vi and 267.

Beeson et al., Plasma relaxation mechanics of pulsed high power microwave surface flashover, Physics of Plasmas, 20, 093509, Sep. 2013, pp. 1-9.

Bystrzejewski et al., "Catalyst-free synthesis of onion-like carbon nanoparticles," New Carbon Materials, vol. 25, No. 1, Feb. 2010, p. 1-8.

Cadez et al., "Influence of Hydrocarbons on Vibrational Excitation of H2 Molecules", Nuclear Engineering and Design, vol. 241, Apr. 2011, p. 1267-1271.

Gicquel et al., "New Driving Parameters for Diamond Deposition Reactors: Pulsed Mode versus Continuous Mode", Materials Research, vol. 6, No. 1, p. 25-37, Sep. 2002.

International Search Report and Written Opinion dated Feb. 9, 2018 for PCT Application No. PCT/US2017/057892.

International Search Report dated Aug. 23, 2018 for PCT Patent Application No. PCT/US2018/015674.

International Search Report dated Jan. 24, 2018 for PCT Patent Application No. PCT/US/2017/055337.

International Search Report dated Jul. 9, 2018 for PCT Patent Application No. PCT/US2018/022420.

International Search Report dated Jun. 25, 2018 for PCT Patent Application No. PCT/US2018/022072.

International Search Report dated Jun. 27, 2018 for PCT Patent Application No. PCT/US2018/015671.

International Search Report dated Jun. 28, 2018 for PCT Patent Application No. PCT/US2018/020963.

(56) References Cited

OTHER PUBLICATIONS

Jasinski et al., "Hydrogen Production via Methane Reforming Using Various Microwave Plasma Sources", Chem. Listy 102, s1332-s1337, Jan. 2008.

Konno et al., "Direct Preparation of Hydrogen and Carbon Nanotubes by Microwave Plasma Decomposition of Methane over Fe/Si Activated by Biased Hydrogen Plasma", Green and Sustainable Chemistry, Nov. 2012, 3, p. 19-25.

Majzlikova, Petra et al, "Sensing Properties of Multiwalled Carbon Nanotubes Grown in MW Plasma Torch: Electronic and Electrochemical Behaviour, Gas Sensing, Field Emission, IR Absorption" Sensors, 15, pp. 2644-1661, published Jan. 26, 2015.

Notice of Allowance dated Jan. 11, 2019 for U.S. Appl. No. 167/003,680.

Notice of Allowance dated Jul. 19, 2017 for U.S. Appl. No. 15/351,858.

Notice of Allowance dated Jun. 29, 2018 for U.S. Appl. No. 15/794,965.

Notice of Allowance dated Mar. 16, 2018 for U.S. Appl. No. 15/711,620.

Notice of Allowance dated May 24, 2017 for U.S. Appl. No. 15/428,474.

Notice of Allowance dated Oct. 11, 2018 for U.S. Appl. No. 15/725,928.

Office Action dated Dec. 28, 2017 for U.S. Appl. No. 15/725,928.
Office Action dated Jul. 10, 2018 for U.S. Appl. No. 15/725,928.
Office Action dated Jun. 26, 2018 for U.S. Appl. No. 15/727,533.
Office Action dated Mar. 23, 2017 for U.S. Appl. No. 15/428,474.
Office Action dated Mar. 9, 2017 for U.S. Appl. No. 15/351,858.
Office Action dated Nov. 1, 2018 for U.S. Appl. No. 15/918,422.
Office Action dated Nov. 29, 2017 for U.S. Appl. No. 15/711,620.
Office Action dated Sep. 20, 2018 for U.S. Appl. No. 16/003,680.

* cited by examiner

PRESSURE BARRIER COMPRISING A TRANSPARENT MICROWAVE WINDOW PROVIDING A PRESSURE DIFFERENCE ON OPPOSITE SIDES OF THE WINDOW

RELATED APPLICATIONS

This application claims the benefit of U.S. Provisional Patent Application No. 62/617,605, filed on Jan. 16, 2018, and entitled "Microwave Transparent Pressure Barrier"; which is hereby incorporated by reference for all purposes.

BACKGROUND

Microwave plasmas are useful for processing various materials, such as chemical processing of gases or materials deposition systems. These systems can benefit from either high pressures or vacuum in a processing chamber, and typically contain dielectric windows through which the microwave power is provided to the processing chamber.

For example, industrial chemical processing of gases using microwaves can be accomplished by flowing the gases to be reacted through an elongated vessel while microwave energy is coupled into the vessel to generate a plasma. The plasma cracks the gas molecules into component species, such as the conversion of methane into hydrogen and carbon particulates, or the conversion of carbon dioxide into oxygen and carbon. Typical systems for microwave processing (e.g., chemical gas processing) include a quartz reaction chamber through which process materials flow, and a microwave magnetron source coupled to the reaction chamber through a waveguide. Systems are designed to control the effective coupling of the microwave energy into the reaction chamber, and the gas flow within the reaction chamber to improve the energy absorption by the flowing gas.

For the above reasons, microwave plasma reactors typically include a pressure barrier between a higher pressure and a lower pressure region of the reactor, that serves as a window through which microwave energy can penetrate and be used to create a plasma for processing of materials in the reactor. Pressure barriers also generally serve as a mechanical safety barrier to prevent a plasma created in a processing chamber from backflowing into the microwave energy source.

SUMMARY OF THE INVENTION

In some embodiments, a pressure barrier comprises a window with a first side and a second side, a main section comprising a length, a first end, and a second end opposite the first end, a first gradient compression section adjacent to the first end of the main section, and a second gradient decompression section adjacent to the second end of the main section. A pressure difference can be formed between the first and second side of the window. In some embodiments, the gradient compression section comprises a first portion of the window, the main section comprises a second portion of the window, and the gradient decompression section comprises a third portion of the window. The window can comprise a dielectric material, where an average dielectric constant of the gradient compression section increases toward the main section, and an average dielectric constant of the gradient decompression section decreases away from the main section. A microwave propagating in a propagation direction can enter the pressure barrier at the gradient compression section, travels along the length of the main section, and exit the pressure barrier through the gradient decompression section.

In some embodiments, a pressure barrier, comprises a first window and a second window separated by a distance L, wherein the first and second windows each comprise a first and a second side. The pressure barrier can also comprise a first waveguide adjacent to the first side of the first widow, and a second waveguide adjacent to the second side of the second widow. The pressure barrier can also comprise a sealed protective volume between the windows adjacent to the second side of the first window and the first side of the second window. A pressure difference can be formed between the first waveguide adjacent to the first side of the first widow and the second waveguide adjacent to the second side of the second widow. Microwave energy can propagate along the first waveguide, enter the protective volume through the first window, and enter the second waveguide through the second window. The first and second windows can also be angled with respect to the propagation direction of the microwave energy through the first waveguide. The distance L can be $n\lambda_g/2$, where n is an integer greater than or equal to 1, and $\lambda_g$ is the guided wavelength of the microwave energy.

DETAILED DESCRIPTION OF THE INVENTION

Figure 2:
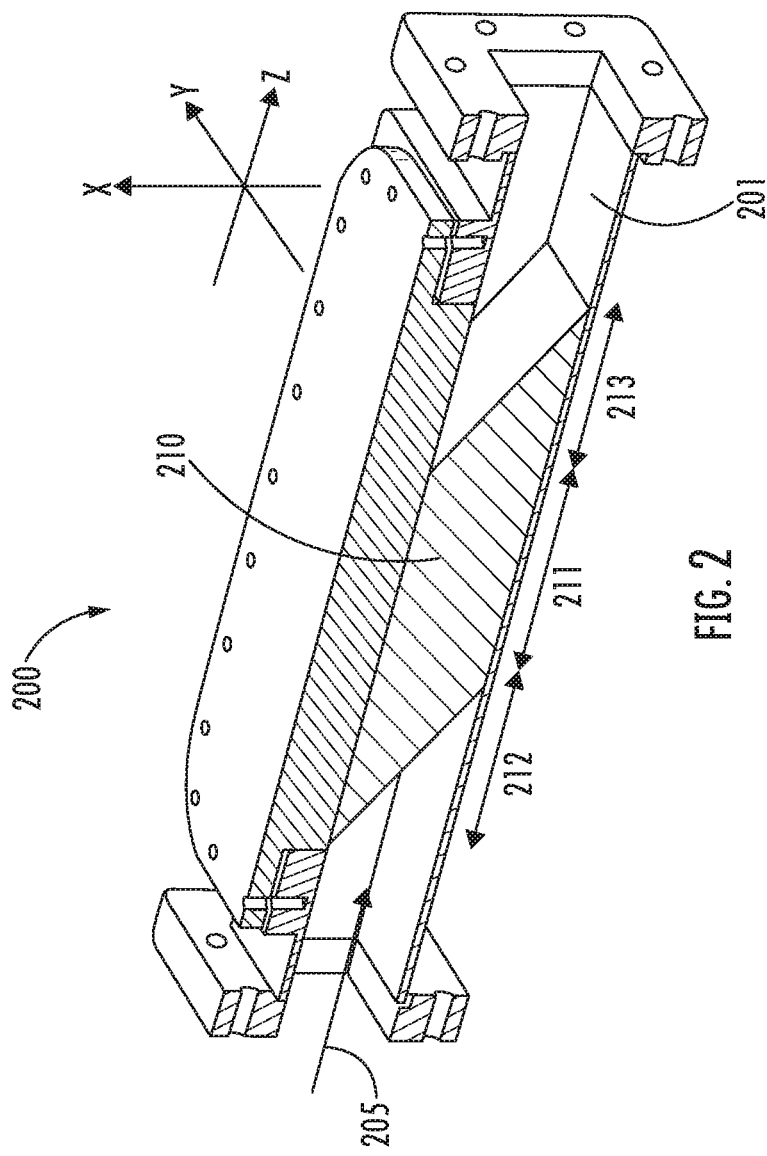
FIG. 2 shows an example of a pressure barrier with a waveguide and a window, in accordance with some embodiments.

The present disclosure describes pressure barriers for microwave reactors. The present pressure barriers can be used in microwave reactors with high power levels in the range of tens to hundreds of kilowatts at pressure differences (i.e., pressure differences across the barrier) greater than 50 psi, or greater than 100 psi, while transmitting sufficient microwave power (e.g., greater than 90%, or greater than 95%), across the pressure barrier. In some embodiments, the present pressure barriers are capable of operating at these high pressure differences and transmit as much or more of the microwave power incident on the pressure barrier, compared with conventional pressure barriers that are not capable of operating at these high pressure differences.

Conventional microwave reactors typically operate at low pressures, such as in the range of vacuum to approximately 30 psi (i.e., pressure difference across the barrier approximately 30 psi, or less). For example, a conventional system may have a microwave source operating at close to atmospheric pressure on one side of a pressure barrier and a process chamber on the other side of the pressure barrier may be at low vacuum, such that the pressure difference across the barrier is approximately 15 psi. Since conventional microwave plasma reactors operate at total and differential pressures below 30 psi, there is no need for windows within conventional systems to withstand substantially higher pressures while minimizing power loss. As such, conventional pressure barriers for waveguides and antennas are not effective barriers for high pressure differences (e.g., greater than 50 psi), and typically have operating limits of 30 psi. Furthermore, conventional pressure barriers for 50 psi can only handle low power levels, such as approximately 3 kilowatts (kW), and as a result, conventional pressure barriers for these systems cannot tolerate high microwave power levels (e.g., greater than 10 kW, or greater than 100 kW).

The ability for a pressure barrier component, such as a window, to withstand higher pressures typically involves increasing the thickness of a material of the component. However, an increased thickness in microwave applications usually results in decreased power transmission, due to the microwave energy being absorbed by the barrier material. In short, design features, such as found in the prior art, that enable a window to operate at higher pressure differentials and/or higher total pressure generally tend to reduce the capacity of the window to operate at high microwave power, and conversely, design modifications that allow a window to operate at higher microwave power generally tend to reduce the capacity of the window to handle higher total and/or differential pressures.

In contrast to conventional pressure barriers, the pressure barriers of the present embodiments can operate at high pressure differences (e.g., above 50 psi, or above 100 psi, or from 10 psi to 200 psi) while transmitting sufficient microwave power (e.g., greater than 90% or greater than 95%) through the use of wave compression and decompression sections. In some embodiments, the pressure barriers will not fail at pressure differences below 300 psi, or 600 psi (e.g., to provide a safety margin for operation at pressure differences such as 100 psi or 200 psi). In some cases, the pressure barrier is located between a microwave source (e.g., a magnetron) and a load (e.g., a microwave plasma) and the pressure on the side of the pressure barrier adjacent to the microwave source is about 7 psi, or about 15 psi, or about 35 psi, or about 50 psi, or about 100 psi, or about 150 psi, or about 300 psi, or about 600 psi, and the pressure on the side of the pressure barrier adjacent to the load is about 7 psi, or about 15 psi, or about 35 psi, or about 50 psi, or about 100 psi, or about 150 psi, or about 300 psi, or about 600 psi.

In some embodiments, the waves are input into a compression section over which the average dielectric constant increases as they are input into the pressure barrier, travel through a main section where the average dielectric constant is approximately constant, and are output through a decompression section over which the average dielectric constant decreases as they exit the pressure barrier. For example, the compression and decompression sections can be made from wedges of dielectric material, and the angle of those wedges can be tuned to mitigate the losses as the window main section is made thicker. In some cases, the angle or taper of the wedges can be changed to accommodate the main window thickness and the other design parameters of the system (e.g., the wavelength of the incident energy).

The term "average dielectric constant" as used herein refers to the effective dielectric constant experienced by a propagating wave at a particular position along the propagation direction averaged over the cross-sectional area (normal to the propagation direction) that is occupied by the wave. For example, the average dielectric constant at a position along the wave propagation direction within a waveguide is the cross-section weighted average of the dielectric constants of the materials within the waveguide at that position (where the cross-section is normal to the microwave power propagation direction). In another example, the average dielectric constant at a position along the wave propagation direction within a waveguide is approximately the volume weighted average of the dielectric constants of the materials within a thin slice of the waveguide (at that position, and with surfaces normal to the microwave power propagation direction) of the materials within the waveguide.

The "average intrinsic impedance" can be defined similar to the average dielectric constant described above. This is because the intrinsic impedance of a material is directly related to (i.e., is inversely proportional to the square root of) the average dielectric constant. Therefore, the compression and decompression regions of the present windows also have gradients in the average intrinsic impedance, which in turn lead to gradients in the waveguide wave impedance.

The gradient of the average dielectric constant in the compression section enable a controlled compression of the wave as the wave slows down in the higher (compared to the gas within a waveguide) dielectric constant of the materials. Similarly, the gradient of the average dielectric constant in the decompression section enables a controlled decompression as the wave exits the dielectric material of the pressure barrier. In contrast, conventional windows do not have gradients in the dielectric constant, and as a result, a propagating wave experiences an abrupt change in dielectric constant when encountering a surface of the window. The graded compression and decompression of the wave reduces the losses within the window, thereby enabling the use of thicker (i.e., longer length in the direction of the microwave propagation) materials that can withstand higher pressures while preserving the energy of the microwave.

In some embodiments, the present pressure barriers containing windows with compression and decompression regions can be located between a microwave source and a plasma reaction zone in a microwave plasma reactor. In such systems, there is an impedance matching device (e.g., a 3-stub tuner) that seeks to maximize the amount of power transferred from the microwave source through the window to the plasma in the reaction zone of the reactor. When the losses within the window are too great, the impedance matching device can sense the window as a load in addition to (or rather than) the plasma, resulting in power disadvantageously transferred to the window (e.g., causing temperature of the window to rise), which also reduces the amount of power transferred from the microwave source to the plasma. Such a situation can occur when a thick window is used (e.g., operable at high pressure differences) that absorbs too much of the microwave energy. In some cases, the losses within the window are large when the window has a relatively well-defined distance from the source (rather than being distributed over a range of distances from the source of roughly the order of a half of a guided wavelength or more). In some cases, the losses within a thick window can be reduced if the window has a thickness that is a substantial fraction of a half loaded guided wavelength, as is discussed further below. Higher microwave source power causes higher temperature rises within the window, because more power will be transferred to the window. In some cases, thermal runaway is possible due to temperature dependent loss properties of the dielectric window. In contrast, windows with compression and decompression regions reduce the ability of the matching device to couple power into the window, thereby reducing loss within the windows and enabling thick windows to absorb less microwave energy within such systems as described above. In some embodiments, the present pressure barriers (containing windows with compression and decompression regions that can operate at high pressure differences) are located between a microwave source and a plasma reaction zone in a microwave plasma reactor, and the impedance matching device between the source and the reactor does not register the window as a significant load compared to that of the plasma. Not to be limited by theory, the compression and decompression regions distribute the localized impedance of the window over a range of distances from the source, and as a result the effective lumped impedance of the window more closely matches the impedance of the waveguide, which enables the improved power transfer through the window. High microwave power can be challenging for pressure barriers in microwave plasma processing systems in particular because at high powers the microwave plasma can densify (i.e., the plasma has a well-defined position and a high electron number density). When the microwave plasma is dense, the load impedance of the plasma is fixed over a narrow range of values. However, at lower power levels, the plasma will be diffuse (i.e., will not be dense) and the load impedance of the plasma will be able to vary over a wider range, which in turn can help the impedance matching device tune into the plasma more efficiently (i.e., more easily tune the impedance of the source to transfer more power to the load).

In some embodiments, the pressure barriers described herein are used in microwave plasma reactors and methods, such as any appropriate microwave reactor and/or method described in U.S. patent application Ser. No. 15/351,858, now issued as U.S. Pat. No. 9,812,295, and entitled "Microwave Chemical Processing," or in U.S. patent application Ser. No. 15/428,474, now issued as U.S. Pat. No. 9,767,992, and entitled "Microwave Chemical Processing Reactor," which are assigned to the same assignee as the present application, and are incorporated herein by reference as if fully set forth herein for all purposes.

Although the above example describes features of the current pressure barriers in the context of microwave plasma reactors, the present pressure barriers can be used in other types of processing equipment utilizing microwave (or other wavelength) energy sources and windows between the source and a process zone where the microwave (or other wavelength) energy is utilized. The present pressure barriers can provide additional benefits in systems utilizing pulsed (rather than continuous wave (CW)) microwave (or other wavelength) energy, since impedance matching is more challenging when the source is pulsed.

In some embodiments, the present pressure barriers are used in a processing system, and a differential pressure environment is created between the two sides of the barrier. For example, the pressure barrier can be used to isolate downstream volatile gases from upstream inert or atmospheric gas. For example, in microwave plasma processing systems, the pressure barrier can separate the source from a process zone. The atmosphere on the side of the pressure barrier adjacent to the source can be an inert gas, nitrogen, argon, or a high breakdown potential gas such as $SF_6$. The atmosphere on the side of the pressure barrier adjacent to the source can be a reactive gas such as hydrogen, a hydrocarbon such as methane, or a dispersion such as silica particles suspended in methane gas. Many other gas combinations are possible, including some with toxic and hazardous gases. When toxic and/or hazardous gases are present, the pressure barriers described herein can also serve as safety containment systems.

Even though the present pressure barrier windows have reduced absorption compared to conventional windows, in some embodiments, a constant absorption of microwave energy in the window causes a rise in the temperature of the window. The temperature rise may be negligible, however, in some embodiments, the temperature rise may be significant. In such cases, the pressure barrier window may be cooled to prevent or mitigate temperature increases. For example, the pressure barrier can have fluid cooling channels in a frame surrounding the window. In some cases, a gas flow may be directed at the window to assist in cooling the window. For example, an inert gas may be directed towards one side of a window that is outside of a process region, and/or a precursor gas may be directed towards a second opposite side of the window that is outside of the process region.

In a non-limiting example, the pressure barrier can contain a window within a waveguide, and the faces of the window can be "angled" with respect to the incident microwaves (i.e., a direction normal to the window surface is misaligned with the microwave propagation direction). In such a case, as the microwave propagates down the waveguide into the window, the average dielectric constant experienced by the microwave increases over the region where the window occupies a greater fraction of the cross-sectional area of the waveguide (i.e., over the compression section).

In a second non-limiting example, the pressure barrier can contain a window within a waveguide, and the dielectric constant of the materials within the window can increase along the propagation direction in a region adjacent to a first face of the window (i.e., within a compression region), and decrease in a region adjacent to a second face of the window (i.e., within a decompression region). For example, such windows can include a dielectric material with varying mass density (e.g., varying porosity) in the compression and decompression regions. In another example, such windows can include more than one dielectric material in an alloy or mixture whose composition changes within the compression and decompression regions. In another example, such windows can include a dielectric material with varying point defect (e.g., vacancies, substitutional defects, and/or interstitials) concentrations within the compression and decompression regions. A method by which the above windows can be fabricated is using 3-D (additive) printing, for example using equipment that is capable of printing more than one type of dielectric material (e.g., polymeric materials, such as those described herein) in various mass-fractions, shapes and patterns. Alternatively, the above windows can be fabricated by assembling small units (e.g., particles, wires, spheres, rods, etc.) of different dielectric constant materials (e.g., polymeric materials, such as those described herein) and then annealing (and optionally further shaping and/or polishing) to form a window with a graded dielectric constant. For example, a first mixture of particles with a low average dielectric constant can be poured into a mold to form a first layer. Then, a second layer with a higher average dielectric constant can be formed on top of the first layer by pouring a second mixture of particles with a higher average dielectric constant into the mold. This process can be repeated until the desired thickness and dielectric constant profile is established, and then the mold can be annealed and optionally further shaped and/or polished to form the window. Alternatively, lasers can be used to locally modify the properties of a window material (e.g., crystallinity, defect concentration, etc.) in 3-D to form dielectric constant gradients in materials. Other methods can also be used to fabricate the present windows with graded dielectric constants, and the present windows are not limited to any particular fabrication technique.

The gradients of the average dielectric constant in the compression and decompression sections can be formed using many different combinations of geometries as well as materials. For example, the present windows can contain silica, fused silica, quartz, fused quartz, polystyrene, polypropylene, polyethylene, Kapton (i.e., polyimide), Teflon (i.e., polytetrafluoroethylene, PTFE), and combinations thereof.

In some embodiments, a dielectric window within the present pressure barriers interacts with a propagating microwave where some energy is reflected, some energy is absorbed, and some energy is transmitted. In some embodiments, the present pressure barriers are used in a waveguide, and the pressure barrier window is capable of transmitting a high fraction of microwave power through the pressure barrier in the waveguide, such as greater than 80%, or greater than 85%, or greater than 90%, or greater than 95%, or greater than 98%, or greater than 99%, or greater than 99.9%.

In some embodiments, the window within the pressure barrier is angled or tapered to reduce the microwave losses due to the window and enable the impedance matching device to more efficiently deliver power through the window in the waveguide structure over a narrow but non-negligible range of microwave frequencies. Conventional low-cost microwave sources, such as magnetrons in particular, may produce microwave power at a range of frequencies rather than at a single frequency that is for practical purposes arbitrarily precise. In some embodiments, a secondary window can be added to the pressure barrier for additional safety and to provide a protection volume whereby process gases leaking from the processing side could be vented safely and diluted thru the central region between two or more windows. In some embodiments, pressure sensing elements within a volume between the two windows can detect the loss of pressure integrity to shut down the power input through electrical signaling means. Additionally, a high breakdown strength gas such as $SF_6$ can be inserted into this section to reduce the chances of breakdown and plasma discharge.

In some embodiments, it is advantageous to increase the pressure across the window (e.g., have higher pressure in a reaction region compared to a microwave source region to improve reaction rates during microwave plasma materials processing). As the pressure difference across the window increases, the window needs to be thicker to accommodate the higher pressure differences, which results in increased losses (e.g., in absorption and/or reflection). As described above, the present pressure barriers solve this problem by introducing gradient compression and decompression sections surrounding a main section of the window.

Figure 1:
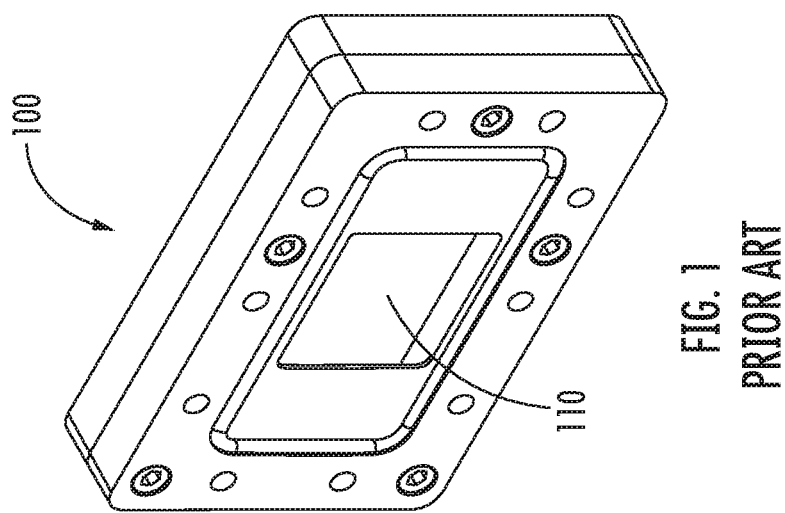
FIG. 1 (Prior Art) shows a conventional pressure barrier.

FIG. 1 shows a conventional pressure barrier 100, which has typical specifications of 3 kW, 10% loss of microwave power minimum, 30 psi pressure difference (i.e., across the pressure barrier), and is water cooled. The barrier has a window 110 which is usually quartz.

FIG. 2 shows an example of a pressure barrier 200, with a waveguide 201 and a window 210 of the present disclosure placed inside, in accordance with some embodiments. Directions X, Y and Z are indicated in FIG. 2. The microwave power propagates through the waveguide 201 in the direction shown by arrow 205. The pressure barrier 200 and the window 210 each have a main section (i.e., region) 211, an input section 212 adjacent to a first end of the main section 211, and an output section 213 adjacent to a second end of the main section 211. The input section 212 and the output section 213 taper away from the main section; i.e., forming wedge shapes (or right triangular prisms) and the main section forms a right rectangular prism. The angled input section 212 compresses an incoming wave, such as a microwave provided by an energy source, and the angled output section 213 decompresses the wave after exiting the pressure barrier (e.g., so that the wave can propagate into a reaction zone of the microwave reactor). The pressure barrier 210 can withstand approximately 100 kW of incident microwave power, 1-2% loss of microwave power through the window maximum, greater than 50 psi pressure difference (i.e., across the pressure barrier), and is optionally gas or water cooled.

More generally, the present pressure barriers can withstand pressure differences greater than 10 psi, greater than 50 psi, greater than 100 psi, or from 10 psi to 200 psi, and incident power levels (e.g., of microwave power) greater than 10 kW, or greater than 20 kW, or greater than 50 kW, or greater than 100 kW, or greater than 500 kW. The loss of power when transmitting microwaves (or, waves with other wavelengths) through the present pressure barriers is less than 10%, or less than 5%, or less than 1%, or is from 0.1% to 10%, or is from 0.1% to 2%. The lengths of the compression, decompression and main sections of the windows in the present pressure barriers can be from 1" (1 inch) to 10", or from 1" to 5", or from 1" to 2", or less than 1", in different embodiments with different specification (e.g., window material dielectric constant, window geometries, and required pressure difference).

Figure 2A:
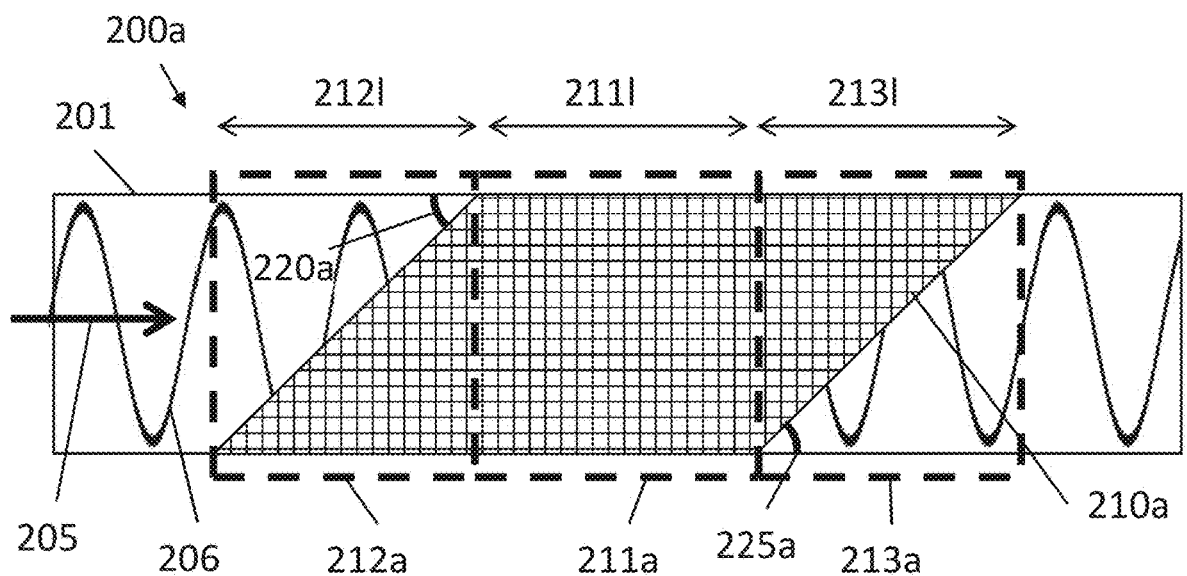
FIGS. 2A-2C show pressure barriers in side views, with waveguides and windows, in accordance with some embodiments.
Figure 2B:
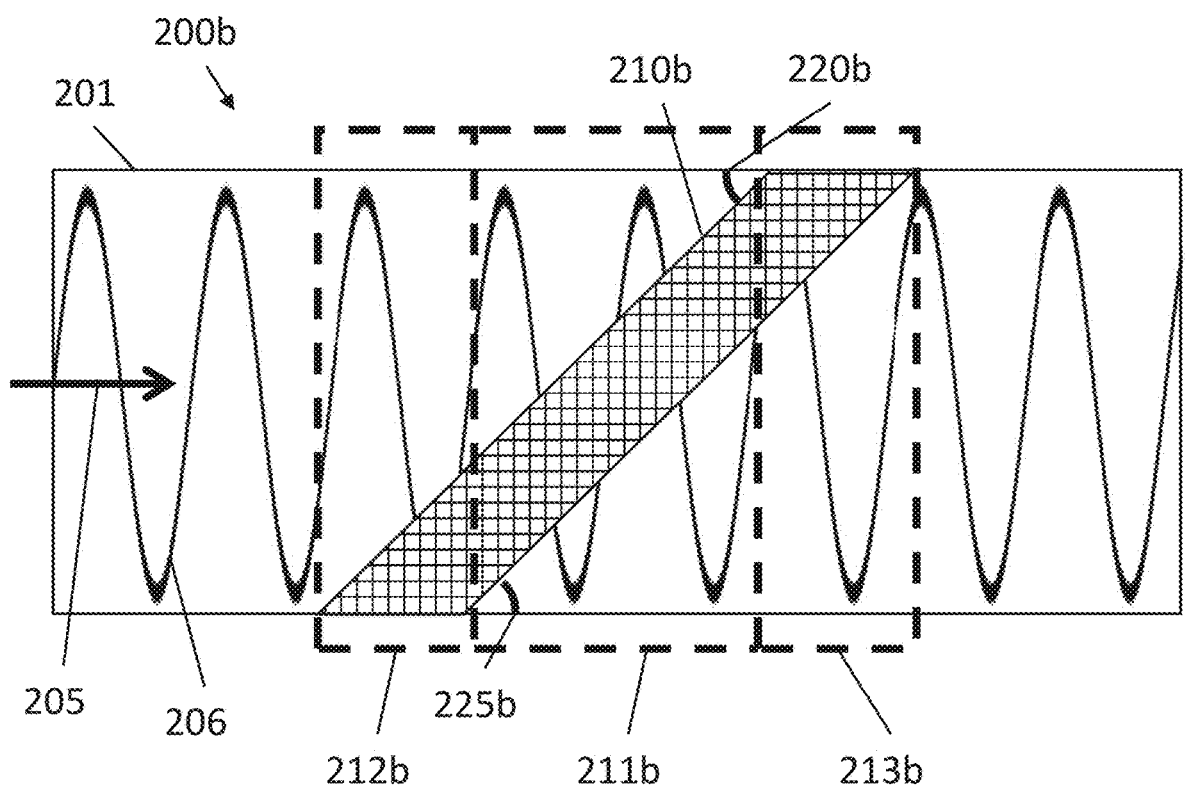

FIGS. 2A and 2B show non-limiting embodiments of pressure barriers 200a and 200b, respectively, in side views, with waveguides 200 and windows 210a and 210b. The windows 210a (FIG. 2A) and 210b (FIG. 2B) of these embodiments are parallelograms in side view. The angles 220a (FIG. 2A) & 220b (FIG. 2B) and 225a (FIG. 2A) & 225b (FIG. 2B) of the parallelogram windows in side view are also shown for the non-limiting embodiments in these figures. For example, angles 220a & 220b and 225a b 225a & 225b can be from 20° to 70°, or from 30° to 70°, or from 30° to 80°, or from 30° to 60°, or from 40° to 60°, or from 50° to 60°, or less than 80°, or less than 70°, or about 50° or about 55°. The window 210a in FIG. 2A has a similar shape as the window 210 in FIG. 2, while the window 210b in FIG. 2B is thinner, and since the angles 220b and 225b are similar to 220a and 225a window 210b has a more oblique parallelogram shaped cross-section than window 210a. The microwave 206 propagates down the waveguide in the direction 205 in FIGS. 2A and 2B, and encounters compression section 212a (FIG. 2A) and 212b (FIG. 2B) first, then propagates through the main section 211a (FIG. 2A) and 211b (FIG. 2B), and then encounters decompression section 213a (FIG. 2A) and 213b (FIG. 2B) before reentering waveguide 201 (FIGS. 2A and 2B). (Note that microwave 206 is a visual aid that represents the magnitude and direction of the microwave electric field (transverse to the propagation direction) as a function of axial position along the waveguide as shown at a single instant in time, and the wavelength and the shape of the microwave 206 in FIGS. 2A and 2B is not drawn to scale.) The lengths of the compression section, main section and decompression section in FIG. 2A are 212l, 211l, and 213l, respectively. The window 210a & 210b contains one or more dielectric materials having one or more dielectric constants (e.g., from 2.2-2.6, or from about 2 to about 3.5, or from about 2 to about 6, all at 2.45 GHz) and loss tangents (e.g., from less than 0.0001 to 0.0005, or from less than 0.0001 to 0.001, or greater than 0.001, all at 2.45 GHz), and the waveguide contains gases (or gas-solid dispersions, or gas-liquid dispersions) on each side of the barrier with a lower dielectric constant (e.g., approximately 1) than those of the window materials. As the microwave propagates through the compression section 212a & 212b (from left to right in FIGS. 2A-2B) the average dielectric constant increases, and there is a corresponding decrease in the (real part of the) intrinsic impedance. The average dielectric constant increases in this example because the window (i.e., a higher dielectric constant material than the surrounding gas or dispersions) occupies a larger fraction of the cross-sectional area of the waveguide when moving from left to right in the compression region. Correspondingly, the average dielectric constant decreases, and there is a corresponding increase in the (real part of the) intrinsic impedance through the decompression section 213a (FIG. 2A) and 213b (FIG. 2B). Note that even though the main section of the window 210b in FIG. 2B does not span the width of the waveguide 201 (FIGS. 2A and 2B), the average dielectric constant throughout the main section is constant, just as in the thicker window embodiment shown in FIG. 2A.

Figure 2C:
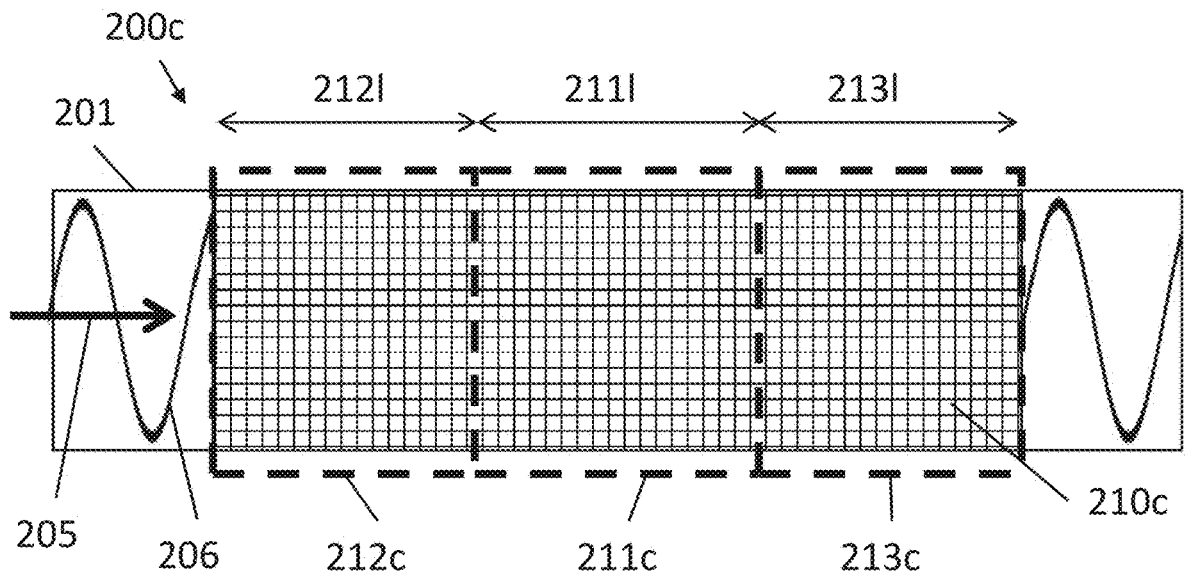
Figure 2D:
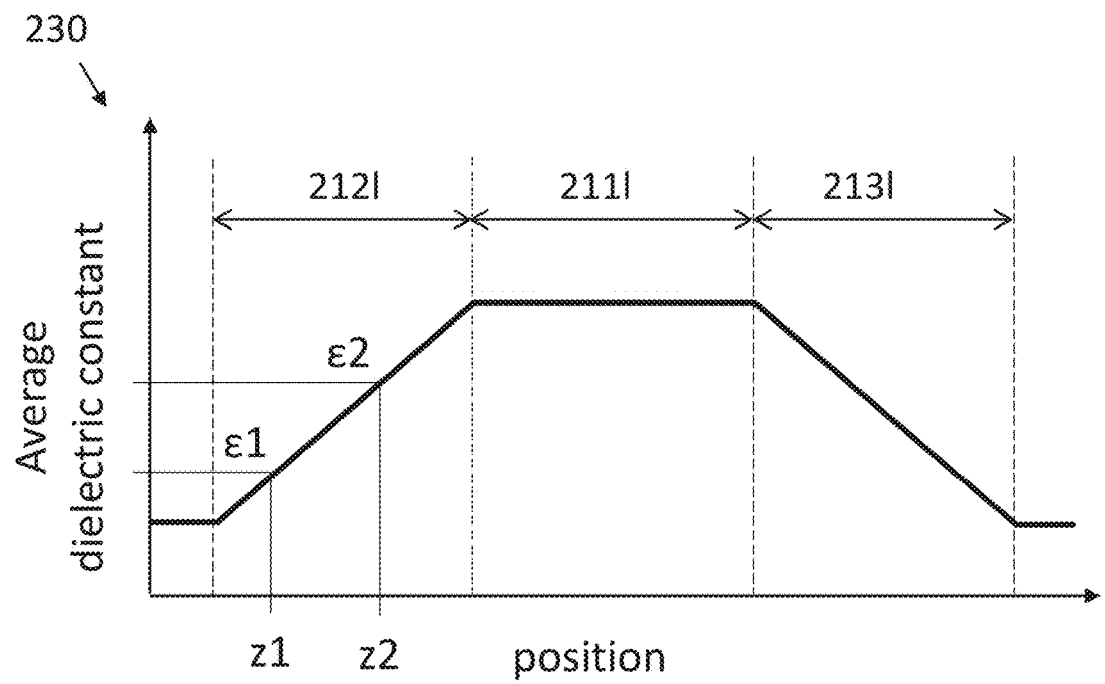
FIG. 2D shows a plot of the average dielectric constant of the pressure barrier in FIG. 2C, in accordance with some embodiments.

FIG. 2C shows another example of a window 210c for a pressure barrier 200c that has a compression region 212c, a main region 211c, and a decompression region 213c. The microwave 206 propagates down the waveguide in the direction 205 in FIG. 2C. In this example, the window 210c is a rectangular prism shape (rectangular in cross-section shown in FIG. 2C), and the compression region 212c and the decompression region 213c are formed using gradients in the average dielectric constant on the materials in the window, in accordance with some embodiments. FIG. 2D shows a plot 230 of the average dielectric constant versus position experienced by wave 206 propagating through the waveguide 201 and the window 210c in FIG. 2C. The x-axis in FIG. 2D is the position along the axial direction of the waveguide 201 (FIG. 2C) for pressure barrier 200c (FIG. 2C). The average dielectric constant increases along length 212l (FIG. 2C), is constant over length 211l (FIG. 2C), and decreases in length 213l (FIG. 2C), corresponding to the compression, main and decompression regions, respectively. In some embodiments, the gradient can be achieved by using layers of materials with different dielectric constants. The gradient of the dielectric constant can be linear (as shown in FIG. 2D), non-linear, stepwise, or other relationship.

In a non-limiting example, the gradients in the average dielectric constant, or intrinsic impedance, of the present windows (e.g., window 210c shown in FIGS. 2C and 2D) may be substantiated by creating a window that fills the body of the waveguide (e.g., in the shape of a rectangular prism), in which the window is created out of two dielectric materials with substantially different dielectric constants, and the two materials are deposited in small "voxels" by a 3D-printer and optionally sintered, in such a manner that gradients in average dielectric constant are formed. For example, referring to FIG. 2D, materials A and B can have different bulk dielectric constants, and at one axial position "z1" along the direction of propagation of waves in the waveguide, a certain fraction of voxels is of material "A" and the remaining fraction is of material "B" producing an average dielectric constant "ε1" at position z1, and at another axial position "z2", the fraction of voxels of material "A" and of material "B" differ from their corresponding values at position "z1" producing an average dielectric constant "c2" at position z2.

Figure 3A:
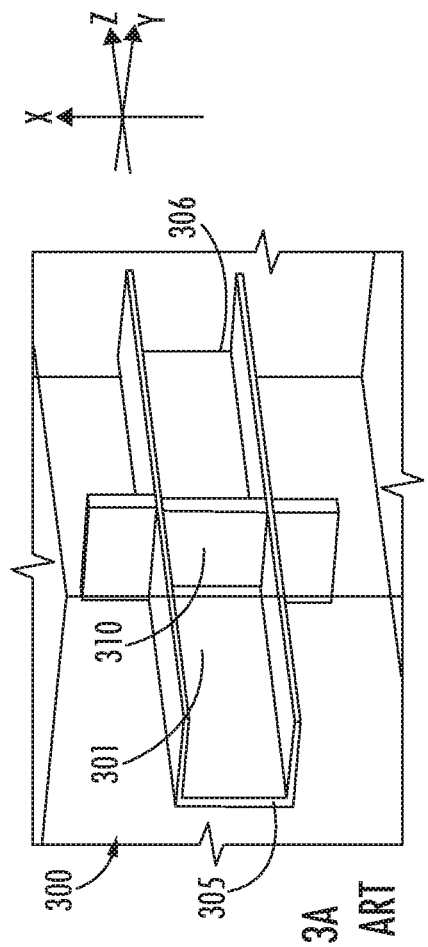
FIG. 3A (Prior Art) shows a conventional pressure barrier in a waveguide with a conventional quartz window used as a barrier.
Figure 3B:
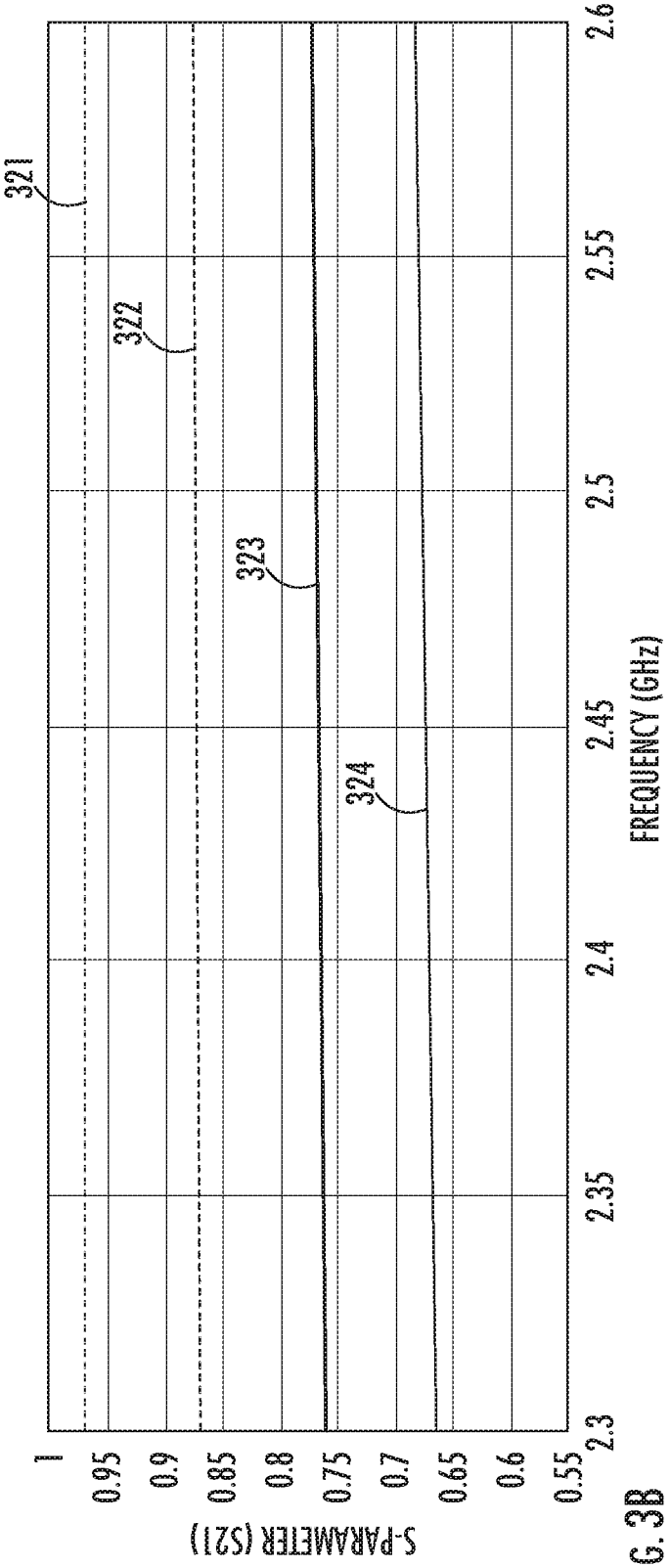
FIG. 3B (Prior Art) shows S-parameter S21 for the window in FIG. 3A with varying dielectric constants.

FIGS. 3A and 3B provide background information on conventional pressure barriers, which are typically made of quartz. In general, electromagnetic waves propagate through dielectric media within waveguides and antennas more slowly than through a vacuum by a factor c, which is the dielectric constant of the material. The dielectric constant of a material, particularly when normalized to the permittivity of free space, is also known as its relative permittivity, or "$\varepsilon_r$," which may also be referred to in this disclosure as "c." The dielectric constant of air is $\varepsilon_r=1.0$, while for quartz $\varepsilon_r$ is approximately 3.75. The dielectric constants and/or loss tangents of high strength materials such as quartz slow down a wave in a waveguide, where the slowing down of the wave results in relatively large power transfer losses. FIG. 3A shows conventional pressure barrier 300 in a waveguide 301 with a conventional quartz window 310 used as a barrier. Microwave energy propagates down the z-axis of the waveguide (i.e., in the z direction), and the window 310 has a surface normal to the z-axis of the waveguide (i.e. the wave propagation direction). The conventional window 310 has a rectangular prism shape (i.e., has rectangular cross-sections in the x-y, x-z, and y-z planes), with a thickness (in the z direction) equal to 0.375 inches. A thickness of 0.375 inches is thicker than typical pressure barrier windows and enables the pressure barrier 300 to operate at pressure differences of greater than about 100 psi across the barrier.

The microwave power transfer through pressure barrier 300 in FIG. 3A was simulated by establishing a microwave source at a first port 305 of the waveguide 301, and placing a load (e.g., a microwave plasma) at a second port 306 of the waveguide 301. FIG. 3B shows S-parameter S21 for four different window dielectric constants. S-parameter S21 describes the power transmitted from the source (i.e., port 1) to the load (i.e., port 2) through the window. The total power transferred from the source to the load is S21 plus any power reflected from port 2 back to port 2 (i.e., S22), however, since S22 is very small in these simulations, S21 is approximately equal to the power transferred from the source to the load. Curve 321 simulates the transmitted power (i.e., S21) for the pressure barrier 300 with a window 310 having a dielectric constant equal to 1.75, while curves 322, 323, and 324 simulate windows with dielectric constants equal to 2.75, 3.75 and 4.75 respectively. The loss tangent for the window 310 was kept constant at 0.0002 for all simulated curves 321-324. The x-axis of the plot in FIG. 3B is the frequency (in GHz) of the guided microwave through pressure barrier 300. The curves 321-324 show that a higher dielectric constant causes less power to transfer from the source to the load through window 310. The lost power (i.e., the power transferred from the microwave source to the quartz window 310) is absorbed by the window 310, which causes the window 310 to become heated. For a conventional 0.375 inch thick window 310 (i.e., that is capable of withstanding 100 psi pressure differences) made from quartz with a dielectric constant of 3.75, curve 323 shows that the power transferred through the window is approximately 75% to 80% at 2.45 GHz. In other words, greater than 20%, or from 20% to 25% of the power will be lost.

Figure 4A:
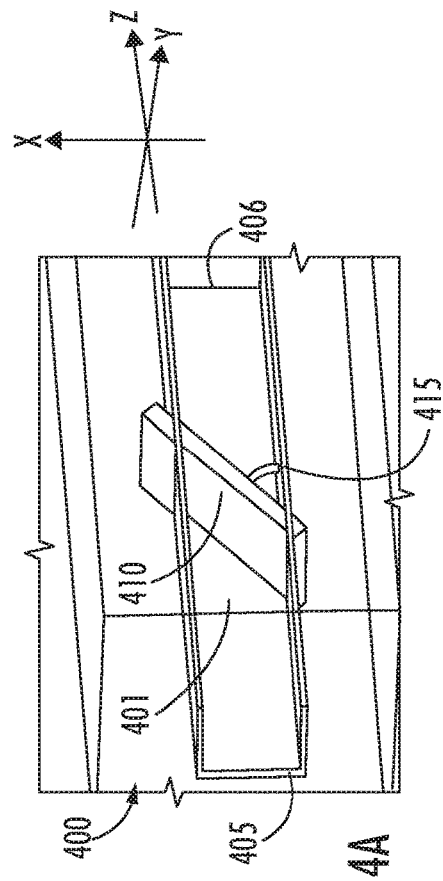
FIG. 4A shows an example of a pressure barrier with a waveguide and a window, in accordance with some embodiments.
Figure 4B:
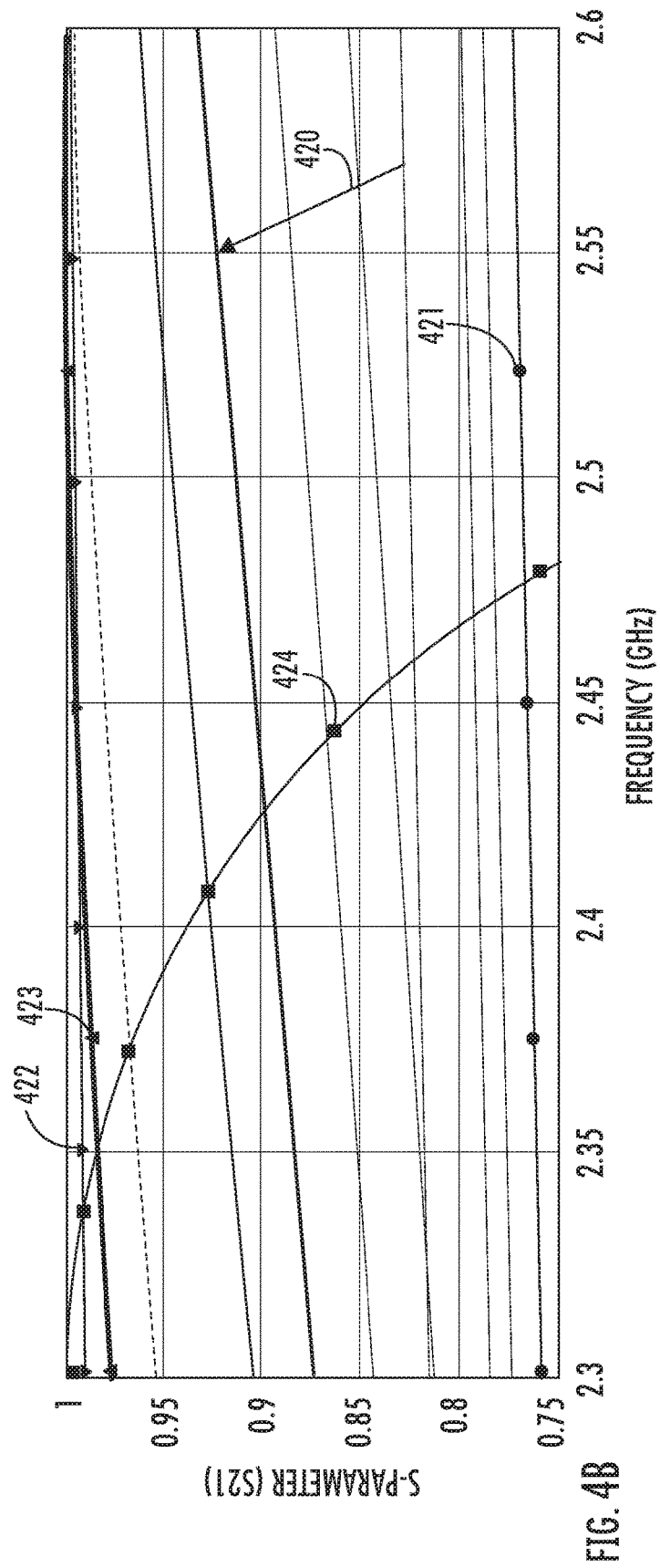
FIG. 4B shows S-parameter S21 for the window in FIG. 4A with varying dielectric constants and tilt angle, in accordance with some embodiments.

FIGS. 4A and 4B are similar to FIGS. 3A and 3B, except FIGS. 4A and 4B respectively show an example schematic and associated S-parameter curves of a present pressure barrier 400 capable of operating at higher pressure differences (e.g., greater than 50 psi, or approximately 100 psi), in accordance with some embodiments. The window 410 of the pressure barrier within waveguide 401 is tilted (or angled) with respect to the z-axis (i.e., the wave propagation direction) of the waveguide 410, and has a similar geometry as the pressure barrier shown in FIG. 2B with a parallelogram shaped cross-section (within the waveguide 401) in the x-z plane. The window 410 in this example is 0.375 inches thick (i.e., in the direction normal to the major surface of the window). In this example, the waveguide 410 is wider in the y direction than the x direction, and the window is tilted by rotating the window around the y-axis. In other embodiments, a waveguide that is wider in the y direction than the x direction, can use a window that is tilted by rotating the window around the x-axis. The angle 415, by which the window 410 is tilted, is shown for one example in FIG. 4A, and various angles 415 were simulated in FIG. 4B.

The microwave power transfer through pressure barrier 400 in FIG. 4A was simulated by establishing a microwave source at a first port 405 of the waveguide 401, and placing a load (e.g., a microwave plasma) at a second port 406 of the waveguide 401. FIG. 4B shows S-parameter S21 for different window tilt angles 415 and dielectric constants. S-parameter S21 describes the power transmitted from the source (i.e., port 1) to the load (i.e., port 2) through the window, similar to the simulations as described for FIGS. 3A and 3B. The x-axis of the plot in FIG. 4B is the frequency (in GHz) of the guided microwave in pressure barrier 400. Curve 421 (with circle symbol markers) shows the example where the window has a tilt angle equal to 0° and a dielectric constant of 3.75, which corresponds to curve 323 in FIG. 3B. A set of curves 420 (shown as lines without symbol markers) simulate the transmitted power (i.e., S21) for the pressure barrier 400 with a window 410 having a dielectric constant equal to 3.75, while the tilt angle 415 is increased from 5° to 50° in 5° increments. The arrow shown for the set of curves 420 shows the trend to higher transferred power with a higher tilt angle.

Curves 422, 423 and 424 (with symbol markers that are inverted triangles, upright triangles, and squares, respectively) in FIG. 4B simulate windows with a tilt angle equal to 53° and dielectric constants equal to 1.75, 3.75 and 5.75, respectively. The loss tangent for the window 410 was kept constant at 0.0002 for all simulated curves in the set of curves 420, and in curves 421-424. The curves 422-424 show that a dielectric constant greater than 3.75 causes less power to transfer from the source to the load through window 410, even at a tilt angle 415 of 53°. For the 0.375 inch thick window 410 in this example that is tilted at an angle of 53° and made from quartz with a dielectric constant of 3.75, curve 423 shows that the power transferred through the window is approximately 98% to 100% (or about 99%) at a frequency of 2.45 GHz. In other words, only 1% to 2% of the power will be absorbed by the window 410 with the parameters simulated in curve 423. Surprisingly, these results are an improvement over a thick (0.375 inches thick) window with faces normal to the wave propagation direction (i.e., with roughly 80% loss), as well as over a thin window only capable of low pressure difference operation (e.g., less than 30 psi pressure differences, and with roughly 10% loss). The simulations also show that there is virtually no increase in loss when changing the dielectric constant of the window from 1.75 to 3.75, as both curves 422 and 423 virtually overlap at 2.45 GHz. The preservation of power for the present window 410 is achieved by the compression region and the decompression region formed by tilting the window with respect to the wave propagation direction. The lost power (i.e., the power transferred from the microwave source to the quartz window 410) is absorbed by the window 410, which causes the window 410 to become heated, however, the lower loss (e.g., roughly 10 to 20 times lower loss) of the present window 410 compared to conventional window 310 means that the window 410 will heat up significantly less than window 310.

Figure 5A:
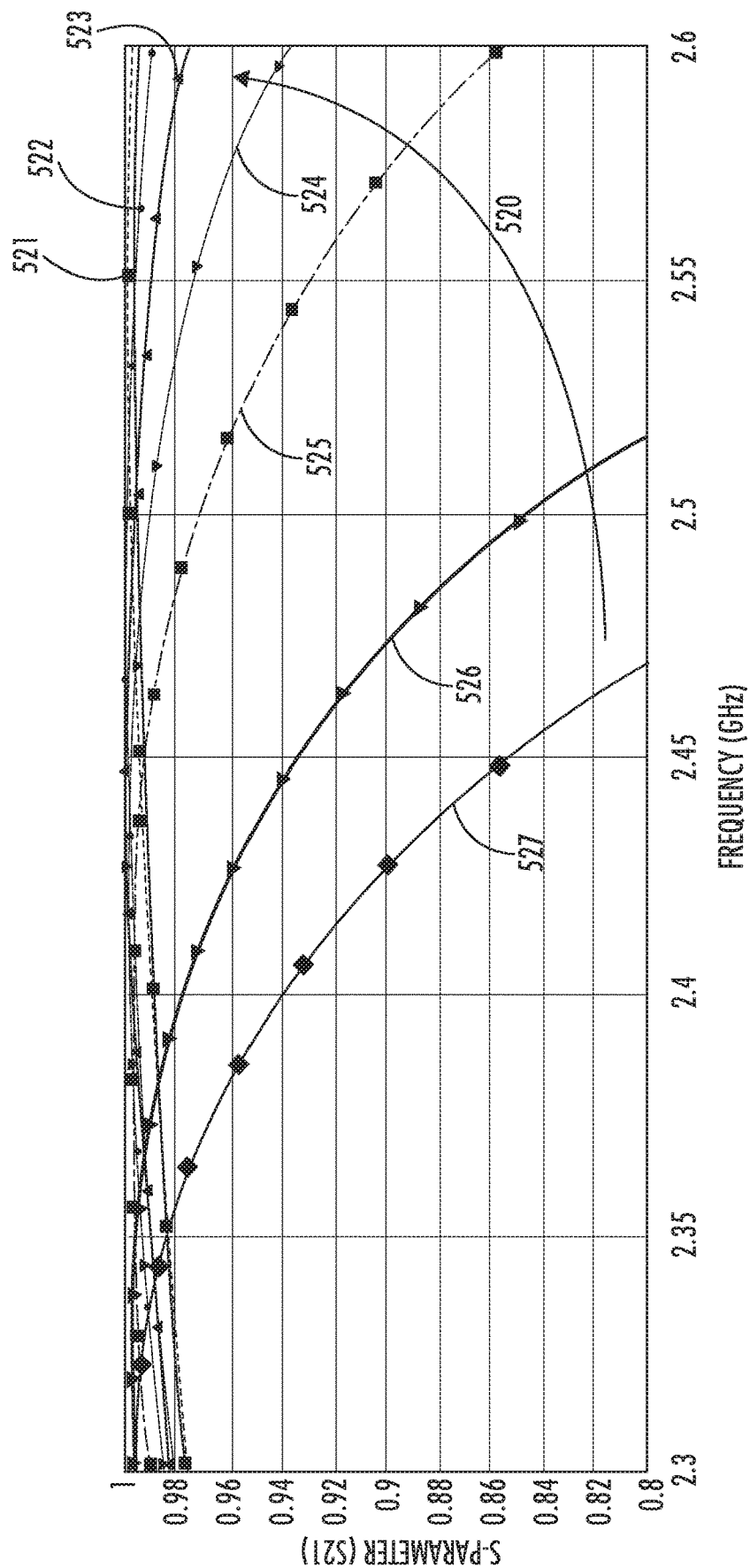
FIG. 5A shows S-parameter S21 for the window in FIG. 4A with varying dielectric constants, in accordance with some embodiments.

FIG. 5A shows simulations of S-parameter S21 for the pressure barrier 400 in FIG. 4A, where the window 410 has a tilt angle of 53° and various dielectric constants, ranging from 1.75 to 5.75. The x-axis is again the frequency (in GHz) of the guided microwave through the pressure barrier 400. A set of curves 520 shows that S21 increases as dielectric constant of window 410 decreases, as shown by the arrow. The dielectric constant for windows simulated by curves, 521, 522, 523, 524, 525, 526 and 527 are 3.75, 4.25, 4.5, 4.75, 5.0, 5.5 and 5.75, respectively.

Figure 5B:
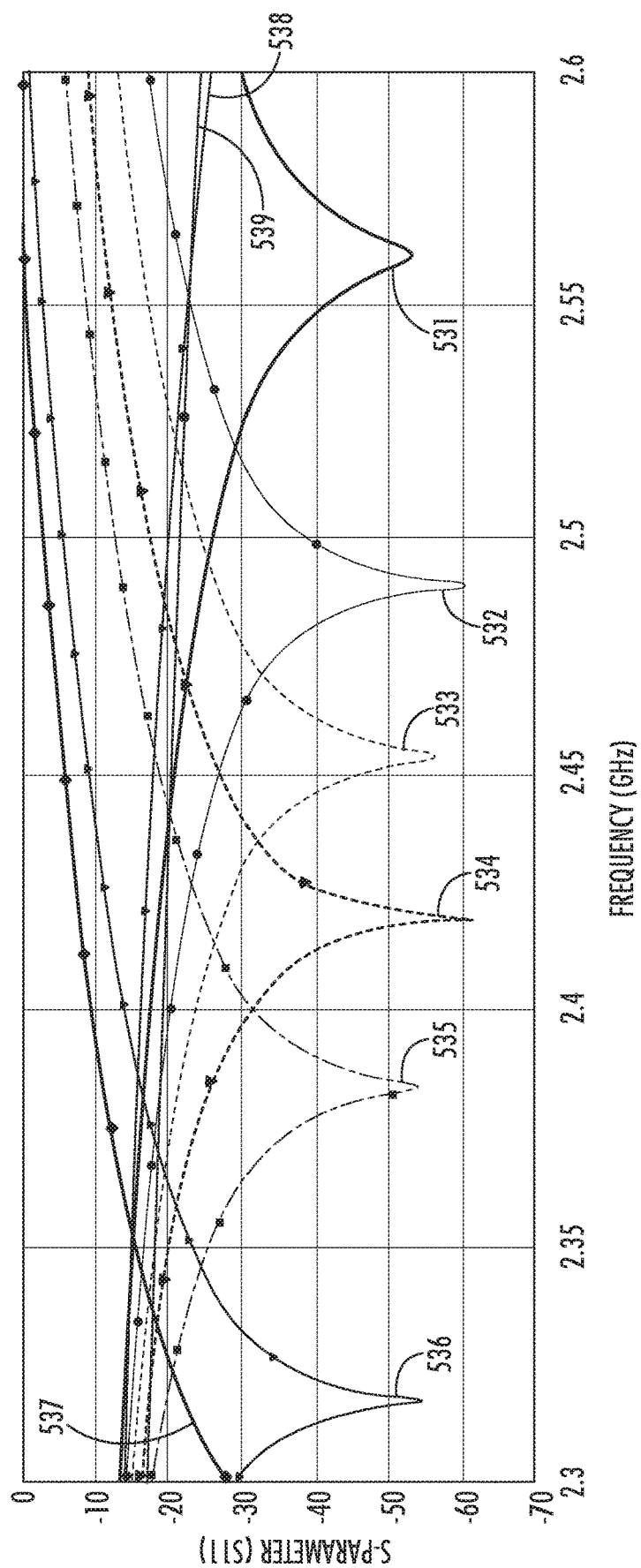
FIG. 5B shows S-parameter S11 for the window in FIG. 4A with varying dielectric constants, in accordance with some embodiments.

FIG. 5B shows simulations of S-parameter S11 (in dB) for the pressure barrier 400 in FIG. 4A, for the same set of simulations depicted in FIG. 5A. The x-axis is again the frequency (in GHz) of the guided microwave through the pressure barrier in GHz. The S-parameter S11 in this example is the amount of power input into source (i.e., port 1) 405 that is reflected back to the source (i.e., port 1) 405. In practice, impedance matching devices will more easily be able to maximize the power transfer from the source to the load when the S11 is lower. The curves in the plot in FIG. 5B show that S11 has a resonant minimum that shifts frequency as the dielectric constant of window 410 changes. The resonance in the pressure barrier 400 that causes these resonant features is a cavity formed within the pressure barrier over the distance occupied by the window (e.g., as shown in regions 212b, 211b and 213b in FIG. 2B, which has a similar geometry as the window 410 in FIG. 4A) The dielectric constant for windows simulated by curves, 531, 532, 533, 534, 535, 536, and 537 are 3.75, 4.25, 4.5, 4.75, 5.0, 5.5, and 5.75, respectively. The plot in FIG. 5B also shows curves 538 and 539, which are simulations of windows with dielectric constants of 2.75 and 1.75, respectively. FIG. 5B shows that there exists a beneficial resonance condition at approximately 2.45 GHz when the window has a dielectric constant of 4.75 and a tilt angle of 53°. Therefore, a system using 2.45 GHz frequency microwaves could reduce the reflection from the window 410 by using a window material with a dielectric constant of 4.75. However, quartz, with a non-optimal dielectric constant of 3.75 has a high power transfer coefficient S21 (as shown in FIG. 5A) and has other beneficial properties (e.g., low loss tangent, high mechanical strength, and is commercially available). This is an example that shows that various factors can be taken into account when designing a pressure barrier and window, including dielectric constant, loss tangent, mechanical properties, and commercial availability.

Figure 6A:
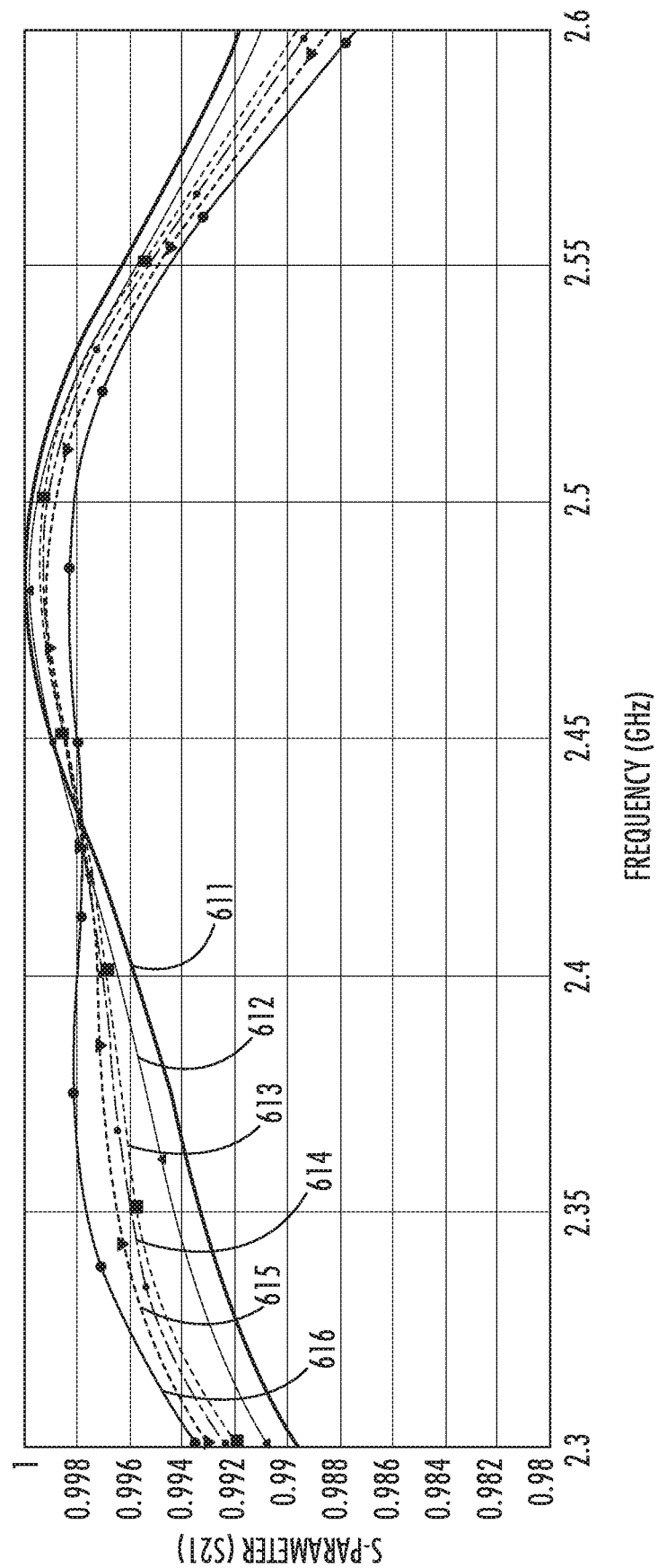
FIG. 6A shows S-parameter S21 for the window in FIG. 4A with varying tilt angles, in accordance with some embodiments.

FIG. 6A shows simulations of S-parameter S21 for the pressure barrier 400 in FIG. 4A, where the window 410 has a dielectric constant of 4.75 and various tilt angles ranging from 55° to 56°. The x-axis is again the frequency of the guided microwave through the pressure barrier 400 in GHz. The curves in the plot in FIG. 6A show that S21 further improved by optimizing the tilt angle of window 410. The tilt angles for windows simulated by curves, 611, 612, 613, 614, 615, and 616 are 55.0, 55.25, 55.5, 55.6, 55.75, and 56.0, respectively. All curves 611-616 show an S21 greater than about 0.99 over the frequency (in GHz) range from 2.3 GHz to 2.6 GHz. This shows that the present windows have high transmission (i.e., power can be effectively transferred from a source to a load through the window) over a relatively wide bandwidth (e.g., greater than +/−150 MHz around a nominal 2.45 GHz). Such a wide bandwidth is beneficial for use in practical systems employing microwave energy sources with some variation in wavelength (e.g., around a nominal 2.45 GHz). Not to be limited by theory, the tilt angles of the present windows (or the dielectric constant gradients, in other embodiments) serve to broaden (i.e., smear out, or soften) the resonance effects by creating less well defined cavities (compared to a conventional rectangular prism window with no tilt) within which the waves can resonate. In other words, tilted mirrors create cavities with lower Q factors, which have characteristically broader resonance features.

Figure 6B:
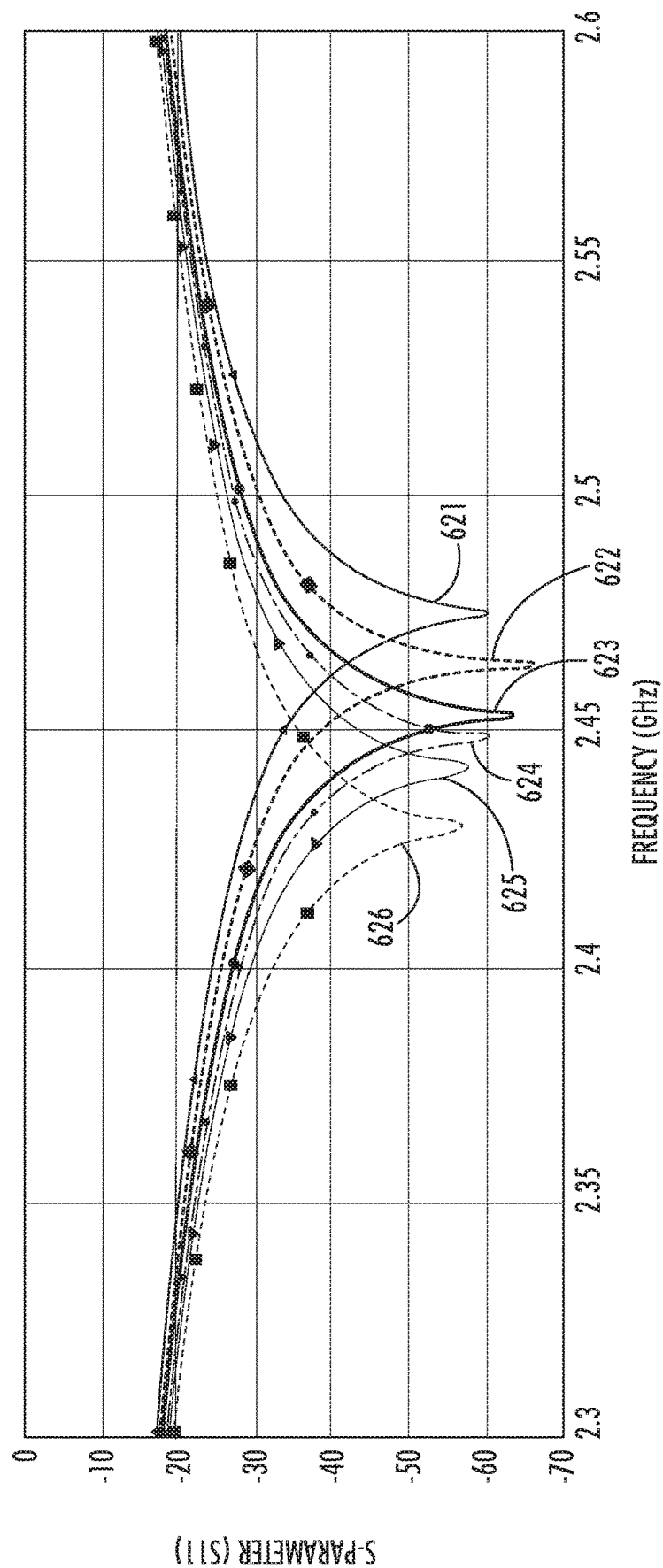
FIG. 6B shows S-parameter S11 for the window in FIG. 4A with varying tilt angles, in accordance with some embodiments.

FIG. 6B shows simulations of S-parameter S11 (in dB) for the pressure barrier 400 in FIG. 4A, for the same set of simulations depicted in FIG. 6A. The x-axis is again the frequency (in GHz) of the microwave through the pressure barrier 400 in GHz. The S-parameter S11 in this example is the amount of power input into source (i.e., port 1) 405 that is reflected back to the source (i.e., port 1) 405. The curves in the plot in FIG. 6B show that S11 has a resonant minimum that shifts frequency as the tilt angle of window 410 changes. The tilt angles for windows simulated by curves, 621, 622, 623, 624, 625, and 626 are 55.0, 55.25, 55.5, 55.6, 55.75, and 56.0, respectively. FIG. 6B shows that the beneficial resonance minimum of S11 is 2.45 GHz when the window has a dielectric constant of 4.75 and a tilt angle of 55.6°. Therefore, a system using 2.45 GHz frequency microwaves could reduce the reflection from the window 410 by using a window material with a dielectric constant of 4.75 and tilting the window to an angle 415 of 55.6°. Advantageously, all of the curves shown in FIG. 6B have S11 less than −30 dB at 2.45 GHz, which is in part due to the wide bandwidth of the S11 resonance dips (i.e., inverted peaks) for the present windows.

The simulation results shown in FIGS. 3A, 3B, 4A, 4B, 5A, 5B, 6A and 6B, comparing the present barriers and conventional pressure barriers, illustrate that a thick window (e.g., 0.375 inches) able to operate at high pressure differences can be made to have virtually no transmission loss if the window dielectric material and tilt angle of the window are adjusted accordingly. When a wave within a waveguide moves from the open portion of the waveguide into a dielectric material, the wave slows down. In a conventional pressure barrier, when an incident wave reaches the window it experiences an abrupt change in dielectric constant, which results in large power transfer losses (e.g., greater than 20%, or greater than 30%, as shown in curves 323 and 324 in FIG. 3B). The present embodiments have windows with major surfaces tilted with respect to the wave propagation direction, enabling an impedance matching system to deliver nearly 100% (e.g., greater than 80%, or greater than 90%, or greater than 95%, or greater than 99%, as shown in FIGS. 4B, 5A, 5B, 6A and 6B) of the power through the window (e.g., to a plasma in a processing zone of a reactor). Not to be limited by theory, the tilting of the window uniquely transitions the waveform into and out of a window of a pressure barrier in a graded fashion (i.e., creates compression and decompression regions with gradients in average dielectric constants), which enables the high power transfer characteristics of the windows described above.

Windows with compression and decompression regions (e.g., those that are have angled faces as shown in FIGS. 2, 2A-2B, and 4A, or those with dielectric constant gradients as shown in FIGS. 2C-2D) allow for atmospheric to high pressure differences across the dielectric and efficient the transfer of high power levels through the window. The dielectric constant(s) of the material(s) in the window, as well as the geometry of the compression, main, and decompression regions of the window, can be tuned to minimize the lost power and maximize the power transmitted through window (e.g., using parametric simulations similar to those shown in FIGS. 4A, 4B, 5A, 5B, 6A and 6B).

In addition to the dielectric constant, the loss tangent of the dielectric material in a window will also affect the amount of power transmitted through the window in the present pressure barriers. For example, the S-parameters of a window with similar geometry as that shown in FIGS. 2 and 2A were simulated. A first simulation was done with a higher loss tangent ethylene tetrafluoroethylene (ETFE, $\varepsilon_r$=2.3, loss tangent about 0.01 at 2.45 GHz) window, and a second simulation was done with a lower loss tangent high density polyethylene (HDPE, $\varepsilon_r$=2.3, loss tangent 0.0003 at 2.45 GHz) window. Similar to the simulations in FIGS. 3A, 3B, 4A, 4B, 5A, 5B, 6A and 6B, the simulated structure had a waveguide with a source and a load, where port 1 of the waveguide was the source and port 2 of the waveguide was the load, and the window was placed in the waveguide between the two ports. The simulated S-parameters of the ETFE window were: S11=0.005, S21=95.3, S12=95.3, S22=0.005. The simulated S-parameters of the HDPE window were: S11=0.001, S21=99.7, S12=99.7, S22=0.001. These simulations show that the loss tangent impacts the power transfer through a pressure barrier window, and that a high amount of power can be transferred (e.g., greater than 99%, or greater than 99.5%, or about 99.7%) using low loss tangent (e.g., less than 0.0005) materials in the present windows. These simulations also illustrate that a high amount of power can be transferred (e.g., greater than 90%, or about 95%, or greater than 95%) using the present windows with a dielectric material with a relatively high loss tangent (e.g., greater than 0.001).

In some embodiments, the one or more dielectric constants of the pressure barrier window material are from 2.2 to 2.6, or from about 2 to about 3.5, or from about 2 to about 6 (all at 2.45 GHz), and the loss tangents are from less than 0.0001 to 0.0005, or from less than 0.0001 to 0.001, or are greater than 0.001 (all at 2.45 GHz). The dielectric constant is chosen to be low enough to allow manageable size of the pressure barrier for the particular application.

Figure 7:
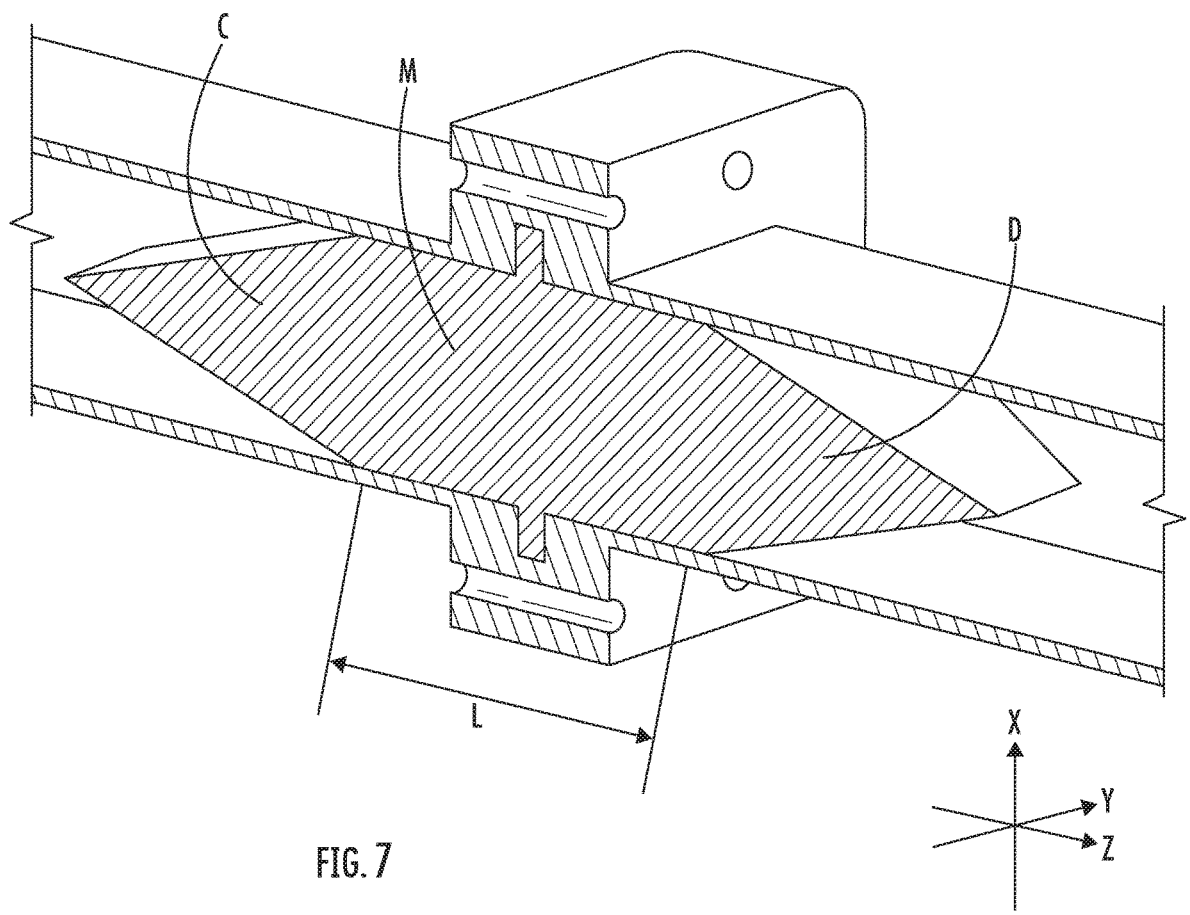
FIGS. 7 and 8 show examples of pressure barrier window shapes and/or materials, in accordance with some embodiments.
Figure 8:
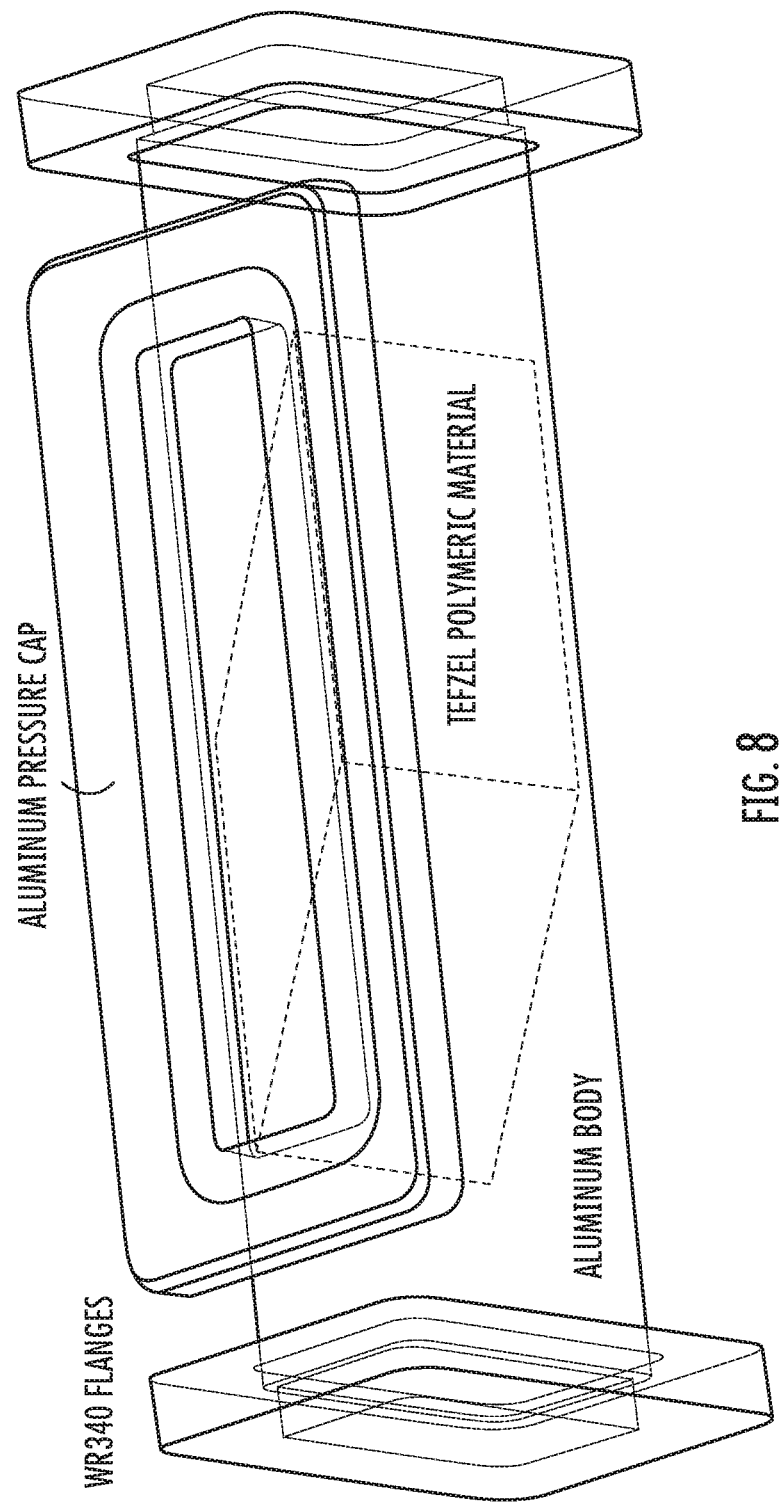

FIGS. 2, 7 and 8 show some examples of shapes of the present pressure barrier windows, where the dielectric windows are shown within a waveguide, in accordance with some embodiments. Directions X, Y and Z are indicated in FIG. 7. FIG. 7 is a diamond shape (as viewed along a longitudinal cross-section, i.e., the Y-Z plane where Z is along the path of microwave propagation in the waveguide), while FIG. 2 is a parallelogram shape in the same relative plane. The window in FIG. 7 has a compression section "C," a decompression section "D," and a main section "M" with length "L." The length L of the main section for any geometry may be, for example, 0.3 inches, 0.4 inches, 0.5 inches, 1 inch, 3 inches, or 6 inches, or greater than 0.3 inches, or greater than 0.5 inches, or greater than 1 inch, or greater than 3 inches, or greater than 6 inches, or from 0.3 inches to 10 inches, or from 0.3 inches to 6 inches, or from 0.3 inches to 3 inches, or from 0.3 inches to 1 inch, in various embodiments. FIG. 8 shows a window with a geometry similar to that of the window in FIG. 2 and provides some non-limiting example materials for the pressure barrier, including a barrier containing a "TEFZEL polymeric material" (i.e., ETFE (TEFZEL®)) and a waveguide containing an "aluminum body" (with "WR340 flanges" and an "aluminum pressure cap", in this non-limiting example). For a microwave frequency of 2.45 GHz, the dielectric constant of the window material can be 2.3, and the main section can have a total length from 0.3 inches to 10 inches (e.g., to withstand high pressure differences). In general, the length of the main section and the compression/decompression sections varies with the dielectric materials used. In some embodiments, the shapes of the compression and decompression sections are not symmetrical. Additionally, the dielectric materials of the central (main) section do not need to be the same as the materials in the compression and/or decompression sections. Other dimensions and materials may be chosen depending on the specific application, and the concepts described herein apply also to other microwave frequencies. Some non-limiting examples of shapes for the compression and decompression sections of the present windows are right triangular prism shapes and pyramidal shapes. In some embodiments, a waveguide that is wider in the y direction than the x direction, can use a window that is tilted by rotating the window around either the y-axis, or the x-axis, or both the x-axis and the y-axis (even though most examples show the window tilted around the y-axis).

In the examples of FIGS. 2, 7 and 8, the shape—that is, the geometrical dimensions—of the dielectric materials provide a gradient compression of the wave within the waveguide, compressing and decompressing over the length of the barrier rather than introducing an abrupt change in dielectric constant within the waveguide, thereby reducing energy loss compared to conventional windows. Similar to the angles for the parallelogram cross-section windows shown in FIGS. 2A and 2B (angles 220a and 220b, and 225a and 225b) and FIG. 4A (angle 415), other window shapes can also be defined by similar angles. For example in FIG. 8, the compression section C and decompression section D may be pyramids with a rectangular bases adjacent to the main section, where a first angle at the apex of the pyramid in the compression section defines the gradient of the dielectric constant increase within the compression section, and a second angle at the apex of the pyramid in the decompression section defines the gradient of the dielectric constant decrease within the decompression section. The gradient can be achieved in various ways, such as but not limited to grading the geometry continuously, in steps, linearly or non-linearly.

The above embodiments demonstrate that windows with square, rectangular, parallelogram, and diamond shaped cross-sections (in the X-Z plane) can all be used if configured correctly to form suitable compression and decompression regions. Factors to be considered in the design of a specific microwave transparent high pressure difference barriers include the microwave frequency, the dielectric constant of the window material, the loss tangent of the window material, the pressure specification, the waveguide dimensions, and the type of gas and/or gas mixtures that could contact the window (e.g., during normal operation, during abnormal operation, or during a failure). The wave compression and decompression regions preserve the microwave power as the wave traverses the pressure barrier, which also results in minimal heating in the dielectric material. This reduces the cooling requirements for the pressure barrier, thus enabling gas or water cooling. Cooling of the pressure barrier could be achieved by, for example, providing cooling channels in a frame surrounding the dielectric material or flowing a cooling substance (e.g., a gas) at one or more faces of the pressure barrier window.

Figure 9:
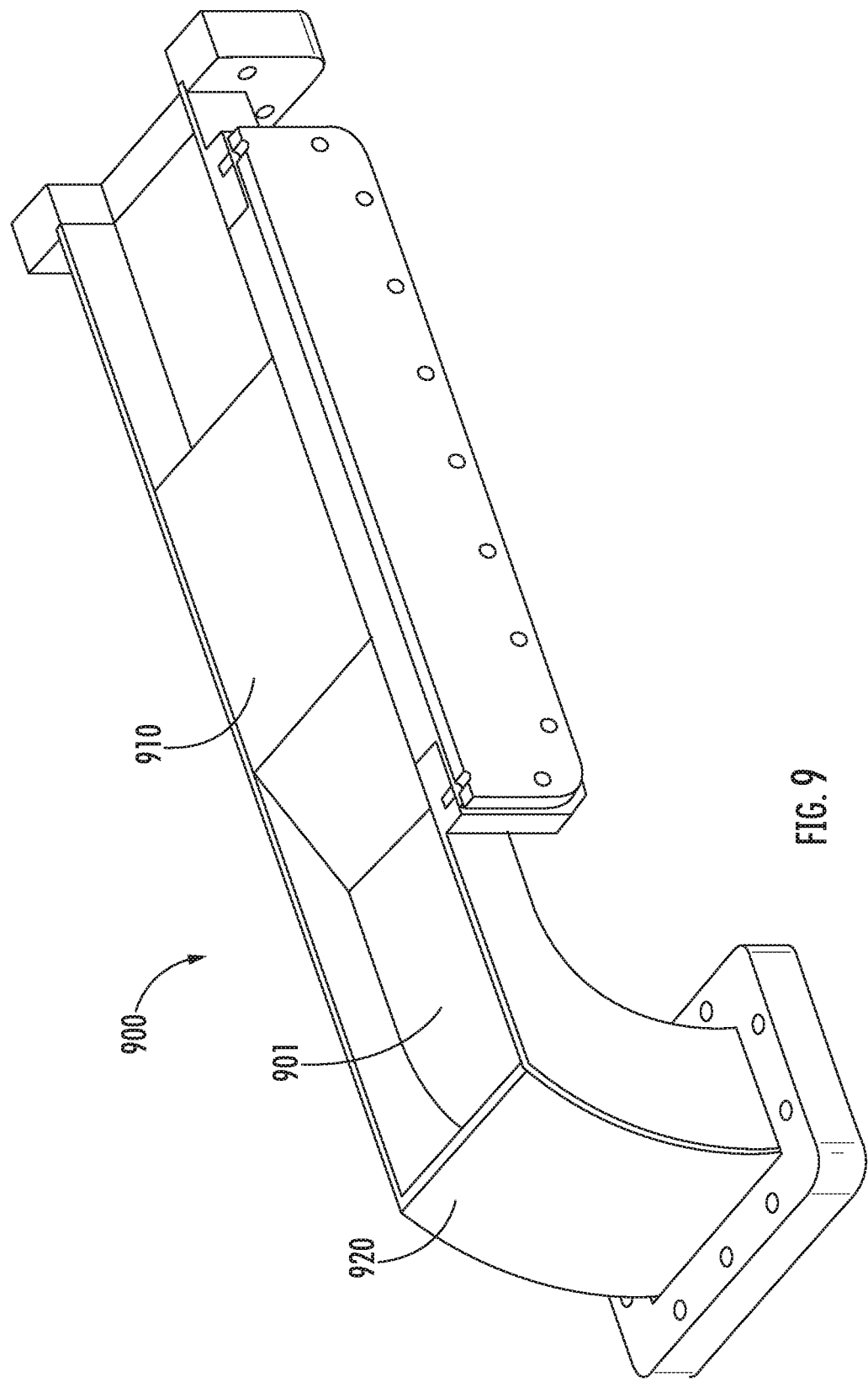
FIG. 9 shows a perspective view of an assembly containing a pressure barrier and an E-bend, in accordance with some embodiments.

FIG. 9 provides a perspective view of an assembly 900 demonstrating that other features can be added to deliver better performance of the system. In this example, the system is a pressure barrier with a window 910 having a parallelogram cross-section, combined with an E-bend 920 in the waveguide 901. E-bends provide a smooth change in the electric field, to correspond to a change in the direction of the waveguide. Some non-limiting examples of other features that can be combined with the present pressure barriers are waveguide E-bends, H-bends, sharp E-bends, sharp H-bends, or twists. These other features in combination with the present pressure barriers allow for microwave energy to propagate along any desired path of a microwave waveguide and/or reactor through different pressure zones (e.g., with different gas species in each zone) while preserving the microwave energy. Additionally, in some embodiments the present pressure barriers can be beneficial in waveguides with circular or elliptical cross-sections (even though all of the examples are shown in the context of rectangular cross-section waveguides). For example, a window can be tilted within waveguides with circular or elliptical cross-sections, or a window can have conical compression and/or decompression regions.

In some embodiments, there may be a pressure seal between interfaces of the pressure barrier window and the walls of the waveguide. Different mechanisms can be used to seal the pressure barrier and window and distribute the pressure around the perimeter of the window. For example, the sealing can be achieved by a wedge shape of the main section of the pressure barrier adjacent to the walls of the waveguide, where the pressure is distributed along the sides. In other embodiments, sealing can involve an O-ring or flat elastomeric seal, or materials that are to be coated onto the pressure barrier. In other adaptations, the dielectric material could be melted into the desired shape of the barrier within the structure of the waveguide itself to innately provide a seal between the pressure barrier and the waveguide. Other methods of ensuring a seal around the pressure barrier are also possible.

Figure 10A:
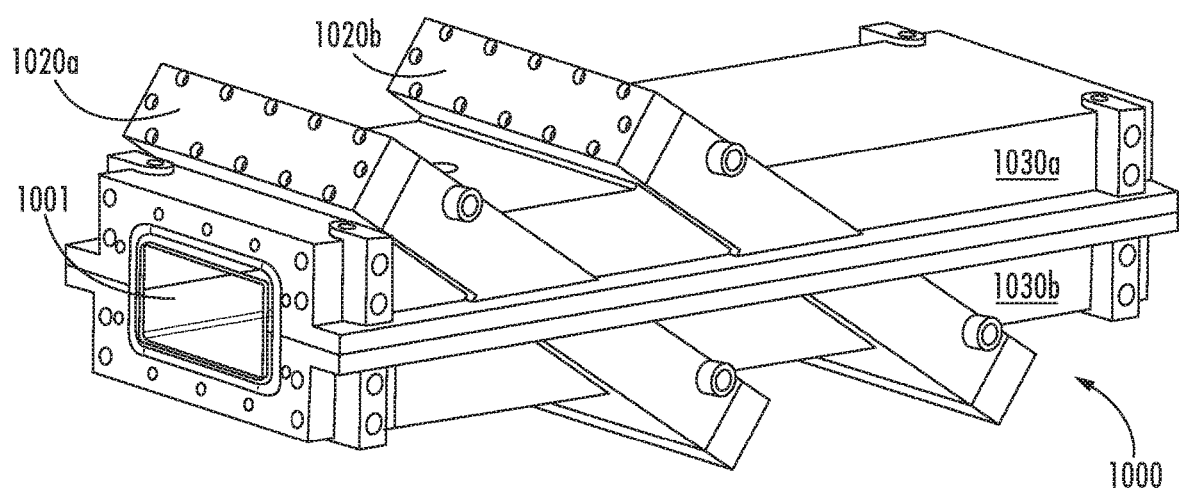
FIGS. 10A-10E show perspective views of a pressure barrier with two windows, in accordance with some embodiments.
Figure 10B:
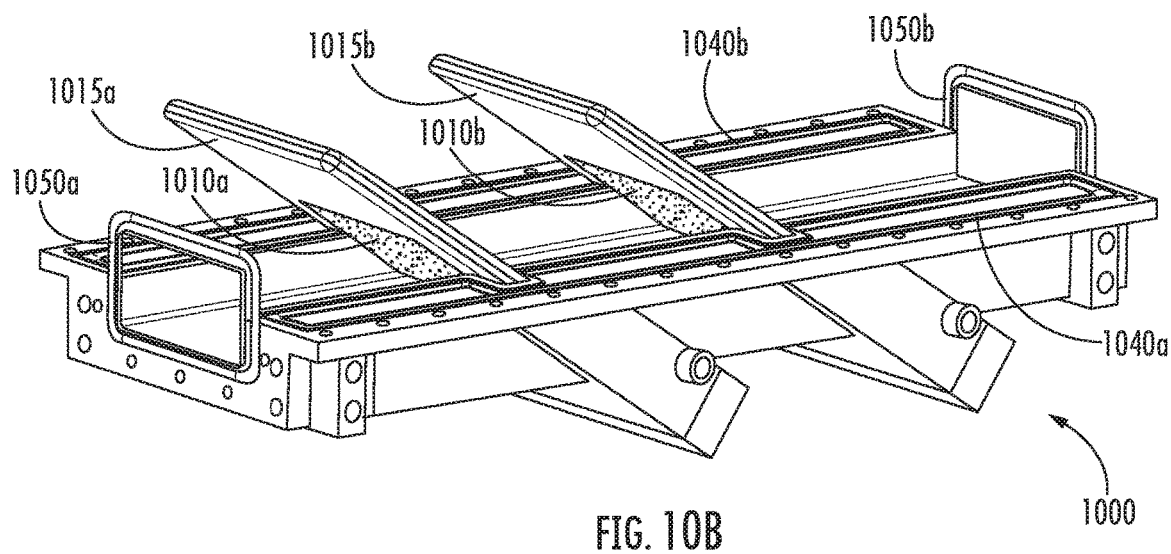
Figure 10D:
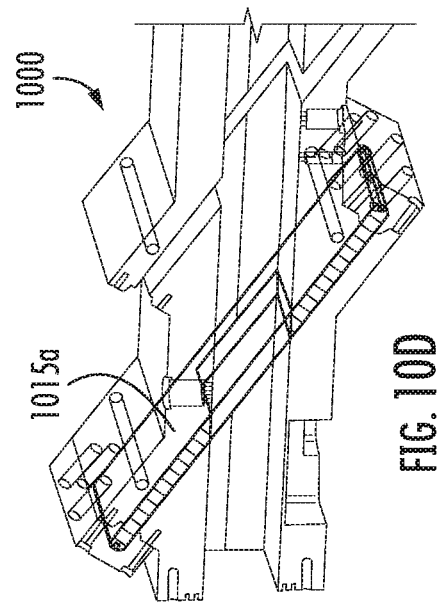
Figure 10C:
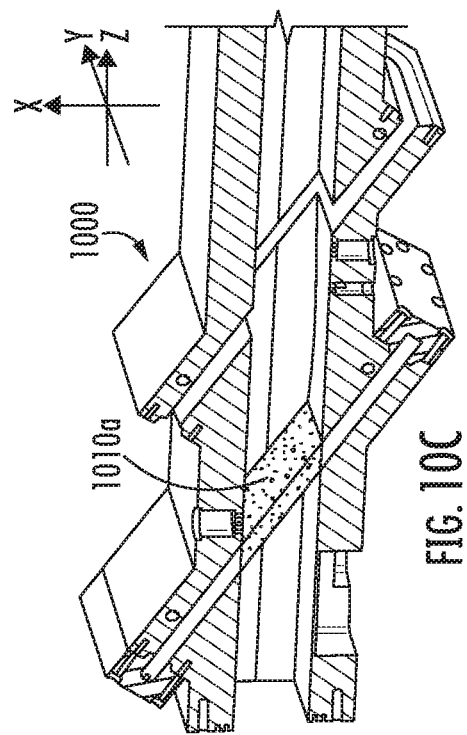
Figure 10E:
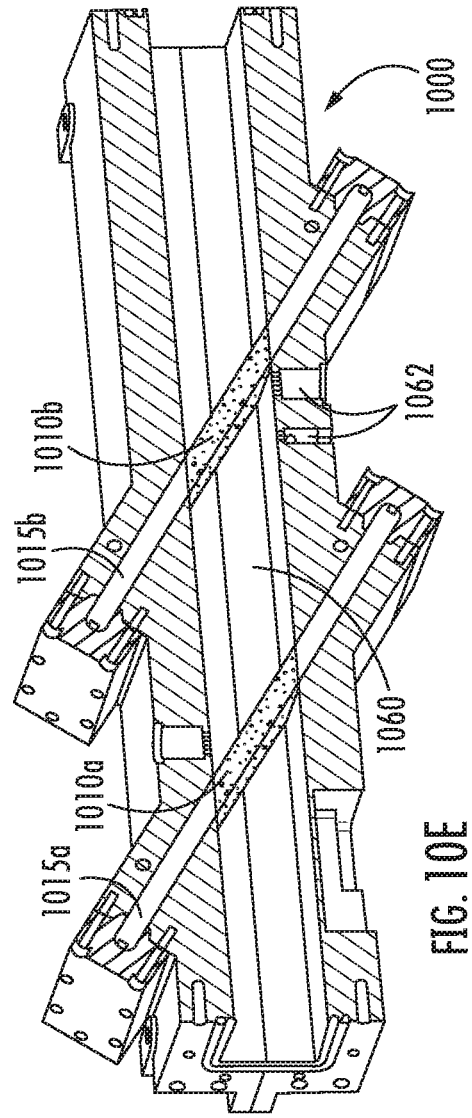

FIGS. 10A-10E show a non-limiting example of a pressure barrier 1000 with two quartz windows 1010a (FIGS. 10B, 10C and 10E) and 1010b (FIGS. 10B and 10E), conductive frames 1015a (FIGS. 10B, 10D and 10E) and 1015b (FIGS. 10B and 10E), end caps 1020a and 1020b (FIG. 10A), a housing with two halves 1030a and 1030b (FIG. 10A) and O-rings 1040a, 1040b, 1050a and 1050b (FIG. 10B). The pressure barrier in this example was designed for use with 30 kW of 2.45 GHz microwaves (either CW or pulsed), and pressure differences during operation of about 200 psi (with a 3× safety margin between the rated pressure difference during operation of about 200 psi and the maximum pressure difference tolerated before failing of about 600 psi). FIG. 10A shows the pressure barrier with both halves of the housing assembled, and FIG. 10B shows the pressure barrier with one half of the housing removed. FIG. 10C shows a cross-section view down a center plane (i.e., the x-z plane) of the pressure barrier with only one quartz window and conductive frame assembled. FIG. 10D shows a partially transparent view of FIG. 10C, where the frame 1015a of the window 1010a is shown as not transparent. FIG. 10E shows a cross-section view down a center plane of the pressure barrier with both quartz windows and conductive frames assembled. FIGS. 10D and 10E illustrate that the frames 1015a and 1015b (FIG. 10E) are designed such that they form a continuous plane of metal on the upper and lower surfaces (i.e., in y-z planes (FIG. 10C)) of the waveguide 1001 (FIG. 10A), which is advantageous to avoid field concentrations and arcing around the pressure barrier and windows.

In this example, a secondary window 1010b is added to the pressure barrier for additional safety and to provide a protection volume 1060 between the two windows. This pressure barrier has two quartz windows 1010a and 1010b surrounded by conductive frames 1015a and 1015b. The quartz windows and frames are hermetically sealed (using end caps 1020a and 1020b) to a housing with two halves 1030a and 1030b that bolt together. The two halves of the housing of the pressure barrier are sealed together using O-rings 1040a and 1040b, and the pressure barrier is coupled and sealed to the waveguide using O-rings 1050a and 1050b. In some embodiments, the protection barrier can also contain one or more dielectric materials (e.g., be filled with a polymeric material).

The design in this example includes ports 1062 for gases (e.g., a gas with a high dielectric breakdown such as $SF_6$) to be input and output from the protection volume, pressure release valves, and ports 1062 for sensors (e.g., pressure transducers) to detect the environment within the protection volume 1060 (e.g., the pressure and/or types of gas species present). For example, in the case of a failure of the window adjacent to a processing zone in a microwave plasma reactor, volatile process gases can leak into the protection volume 1060. The sensors in the protection volume 1060 can sense such a leak (either due to a detected pressure change, or volatile gas, or both), and then trigger a shutdown including venting the protection volume 1060 in a safe manner (e.g., through a volatile gas filter or scrubber). In the case of a catastrophic window failure the pressure release valve within the protection volume 1060 can ensure safe equipment operation, as well as protect the zone of the reactor adjacent to the intact window.

Figure 10F:
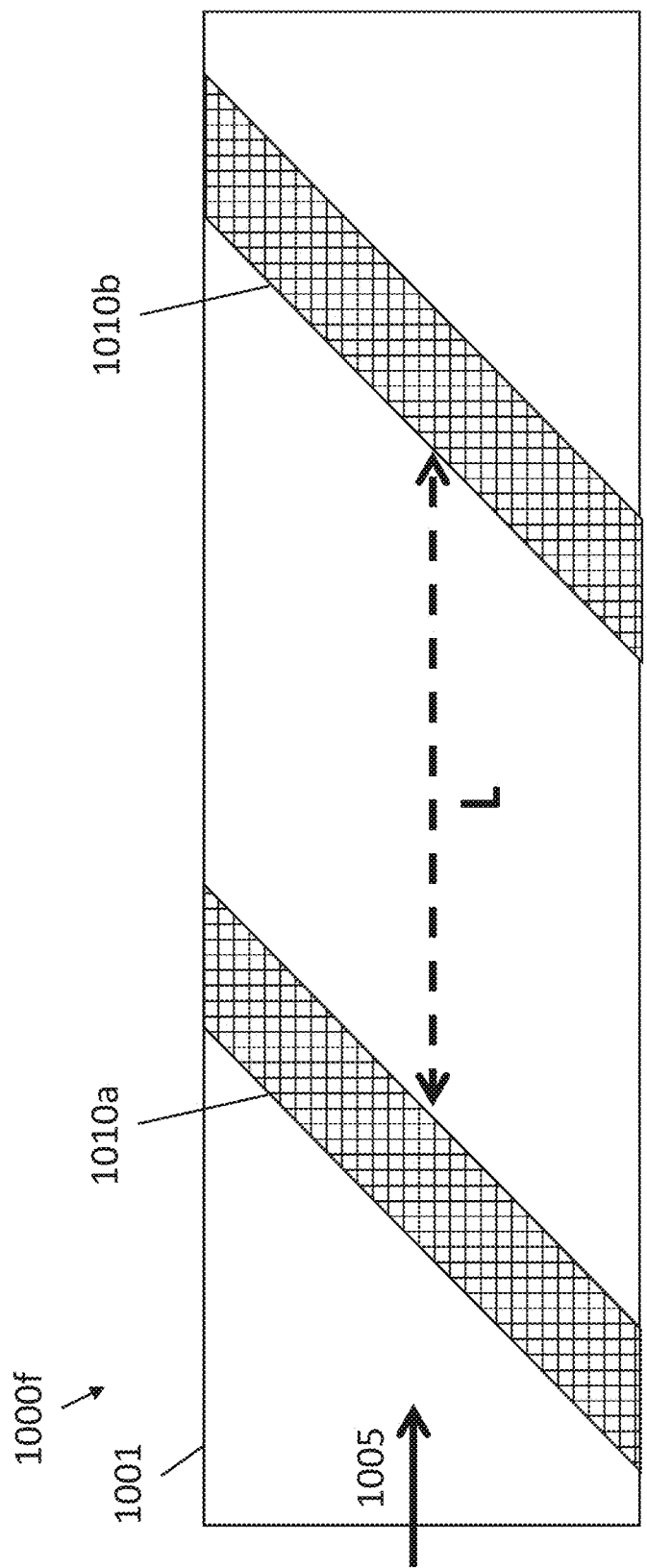
FIG. 10F shows a side view of the pressure barrier in FIGS. 10A-10F.

FIG. 10F shows a non-limiting example of a pressure barrier 1000f, showing the distance L between the windows 1010a and 1010b. The waveguide 1001 and microwave propagation direction 1005 are also shown in FIG. 10F. In addition to the compression section, main section and decompression section (e.g., similar to that shown in FIG. 2B) of each window in the pressure barrier 1000f, in some embodiments, the distance L between the present windows is substantially close to $n\lambda_g/2$ (e.g., within 1%, within 5%, or within 10% of $n\lambda_g/2$), where n is an integer greater than or equal to 1, and $\lambda_g$ is the guided wavelength of the microwave energy (or, in cases where a dielectric material is arranged between the two windows, then $\lambda_g$ is the correspondingly loaded guided wavelength of the microwave energy). Not to be limited by theory, when the distance L follows this relationship the two windows in the pressure barrier will form a resonant cavity, which will further suppress the loss resulting from a microwave passing through the present pressure barriers.

Figure 10G:
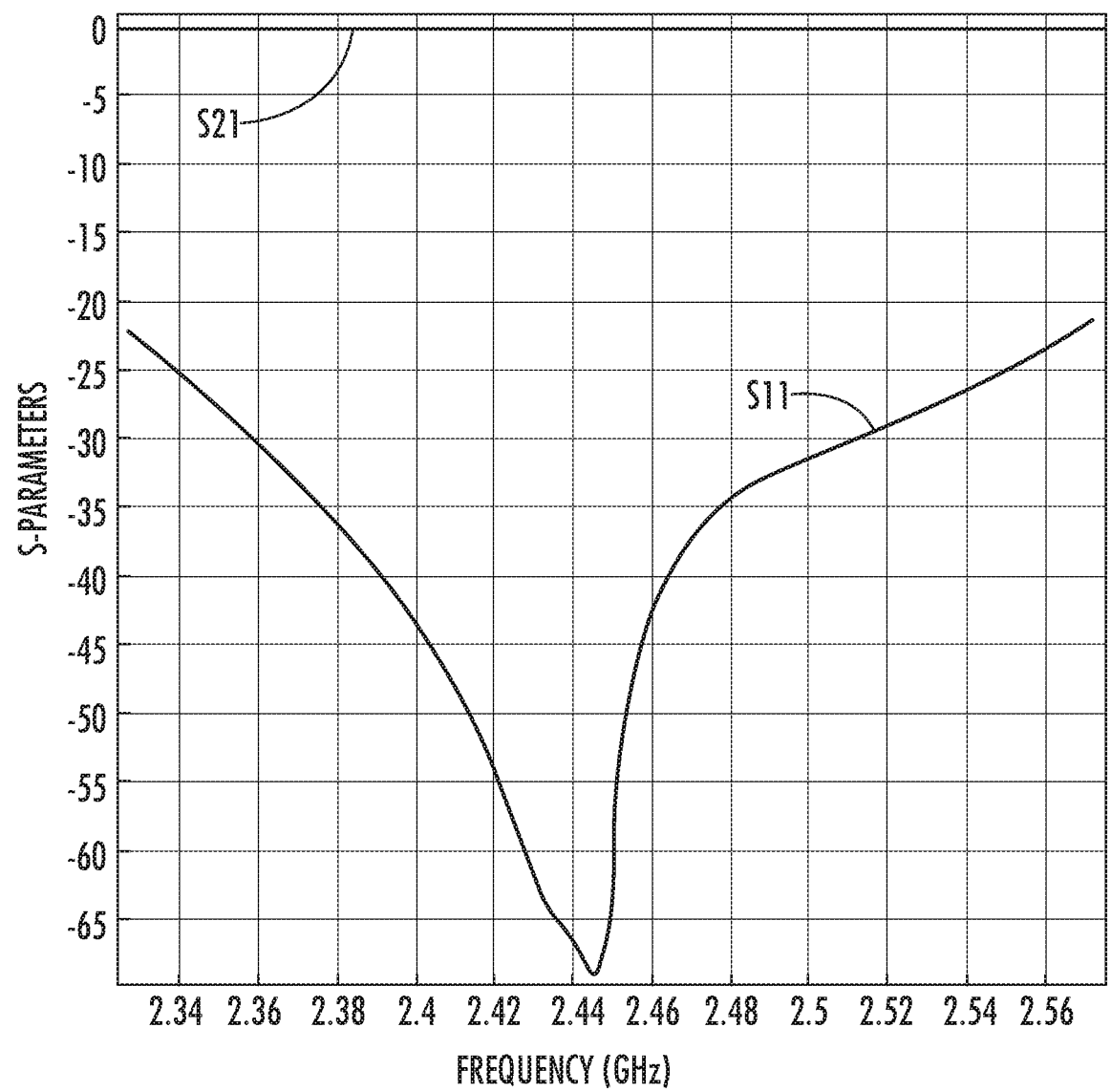
FIG. 10G shows S-parameters S21 and S11 for a window similar to those shown in FIGS. 10A-10F, in accordance with some embodiments.

FIG. 10G shows simulations of S-parameters S21 and S11 for a pressure barrier similar to that shown in FIGS. 10A-10F, containing two tilted windows with a length L between the windows. The x-axis the frequency of the guided microwave in the pressure barrier in GHz. The S21 parameter is very close to 100% in this example. The S11 parameter in this example shows resonant behavior with more resonance features (i.e., multiple overlapping inverted peaks) than were observed in the single tilted window simulations (e.g., the single dips shown in FIGS. 5B and 6B). A source of an additional resonance feature in this example is the resonance between the two windows. The windows in this example were spaced such that the distance L between them was a multiple of $n\lambda_g/2$ (as described above).

In some embodiments, resonance features causing the spectral dips in S11 can come from multiple sources including, but not limited to, the resonance within a pressure barrier region containing a window (e.g., a single thick or tilted window), the resonance between two windows, or a resonance between any reflecting surface in communication with a surface of a window in the pressure barrier. For example, a resonant cavity can be established within a thick window when the thickness is adjusted accordingly (e.g., the thickness is a multiple of a half wavelength of the guided loaded wavelength within the dielectric material of the window). In some embodiments, the resonance within a window can also be tailored (e.g., by changing the thickness of the window) to further increase the total power transmitted from a source to a load through the window(s) of the pressure barrier.

Reference has been made to embodiments of the disclosed invention. Each example has been provided by way of explanation of the present technology, not as a limitation of the present technology. In fact, while the specification has been described in detail with respect to specific embodiments of the invention, it will be appreciated that those skilled in the art, upon attaining an understanding of the foregoing, may readily conceive of alterations to, variations of, and equivalents to these embodiments. For instance, features illustrated or described as part of one embodiment may be used with another embodiment to yield a still further embodiment. Thus, it is intended that the present subject matter covers all such modifications and variations within the scope of the appended claims and their equivalents. These and other modifications and variations to the present invention may be practiced by those of ordinary skill in the art, without departing from the scope of the present invention, which is more particularly set forth in the appended claims. Furthermore, those of ordinary skill in the art will appreciate that the foregoing description is by way of example only, and is not intended to limit the invention.

What is claimed is:

1. A pressure barrier, comprising:
a window with a first side and a second side;
a main section comprising a length, a first end, and a second end opposite the first end;
a first gradient compression section adjacent to the first end of the main section; and
a second gradient decompression section adjacent to the second end of the main section;
wherein:
a pressure difference is formed between the first and second side of the window;
the gradient compression section comprises a first portion of the window;
the main section comprises a second portion of the window;
the gradient decompression section comprises a third portion of the window;
the window comprises a dielectric material;
an average dielectric constant of the gradient compression section increases toward the main section;
an average dielectric constant of the gradient decompression section decreases away from the main section;
a microwave propagating in a propagation direction enters the pressure barrier at the gradient compression section, travels along the length of the main section, and exits the pressure barrier through the gradient decompression section;
a dielectric constant of the dielectric material is from 2 to 10 at 2.45 GHz; and
a loss tangent of the dielectric material is from less than 0.0001 to 0.001 at 2.45 GHz.

2. The pressure barrier of claim 1, wherein:
a cross-sectional area normal to the microwave propagation direction of the first portion of the window increases toward the main section; and
a cross-sectional area normal to the microwave propagation direction of the third portion of the window decreases away from the main section.

3. The pressure barrier of claim 2, wherein:
the second portion of the window comprises a right rectangular prism shape; and
the first and third portions of the window comprise right triangular prism shapes or pyramidal shapes.

4. The pressure barrier of claim 2, wherein the first, second, and third portions of the window together form an oblique prism with rectangular bases.

5. The pressure barrier of claim 1, wherein the pressure difference is greater than 50 psi.

6. The pressure barrier of claim 1, wherein the dielectric material is selected from the group consisting of silica, fused silica, quartz, fused quartz, polystyrene, polypropylene, polyethylene, polyimide, polytetrafluoroethylene, and combinations thereof.

7. The pressure barrier of claim 1, wherein a gas within adjacent to
the pressure barrier is selected from the group consisting of an inert gas, SF6, hydrogen, and a hydrocarbon.

8. The pressure barrier of claim 1, wherein the length of the main section is greater than 0.5 inches, and the microwave has a frequency of 2.45 GHz.

9. A pressure barrier, comprising:
a first window and a second window separated by a distance L, wherein the first and second windows each comprise a first and a second side;
a first waveguide adjacent to the first side of the first window;
a second waveguide adjacent to the second side of the second window; and
a sealed protective volume between the first and second windows adjacent to the second side of the first window and the first side of the second window;
wherein:
a pressure difference is formed between the first waveguide adjacent to the first side of the first window and the second waveguide adjacent to the second side of the second window;
microwave energy propagates along the first waveguide, enters the protective volume through the first window, and enters the second waveguide through the second window;
the first and second windows are angled with respect to a propagation direction of the microwave energy through the first waveguide; and
the distance L is within 5% of $n\lambda_g/2$, where n is an integer greater than or equal to 1, and $\lambda_g$ is the guided wavelength of the microwave energy.

10. The pressure barrier of claim 9, wherein:
the first and second windows are hermetically sealed to a housing;
the housing comprises the first and second waveguides; and
the first waveguide is sealed to a first external waveguide using an O-ring seal and the second waveguide is sealed to a second external waveguide using an O-ring seal.

11. The pressure barrier of claim 9, wherein the first and second windows comprise a dielectric material with a dielectric constant from 2.2 to 2.6.

12. The pressure barrier of claim 11, wherein the dielectric material is selected from the group consisting of silica, fused silica, quartz, fused quartz, polystyrene, polypropylene, polyethylene, polyimide, polytetrafluoroethylene, and combinations thereof.

13. The pressure barrier of claim 9, wherein the thicknesses of the first and second window are greater than 0.5 inches, and the microwave has a frequency of 2.45 GHz.

14. The pressure barrier of claim 9, wherein the pressure difference is greater than 50 psi.

* * * * *